(12) United States Patent
Chang et al.

(10) Patent No.: US 10,845,699 B2
(45) Date of Patent: Nov. 24, 2020

(54) METHOD FOR FORMING PHOTOMASK AND PHOTOLITHOGRAPHY METHOD

(71) Applicant: Taiwan Semiconductor Manufacturing Co., Ltd., Hsinchu (TW)

(72) Inventors: Shih-Ming Chang, Zhubei (TW); Minfeng Chen, Hsinchu (TW); Min-An Yang, Taichung (TW); Shao-Chi Wei, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 183 days.

(21) Appl. No.: 16/045,816

(22) Filed: Jul. 26, 2018

(65) Prior Publication Data

US 2019/0163051 A1 May 30, 2019

Related U.S. Application Data

(60) Provisional application No. 62/591,835, filed on Nov. 29, 2017.

(51) Int. Cl.
*G03F 1/24* (2012.01)
*G03F 1/36* (2012.01)
(Continued)

(52) U.S. Cl.
CPC .............. *G03F 1/58* (2013.01); *G03F 1/24* (2013.01); *G03F 1/36* (2013.01); *G03F 1/72* (2013.01);
(Continued)

(58) Field of Classification Search
None
See application file for complete search history.

(56) References Cited

U.S. PATENT DOCUMENTS 6,013,399 A * 1/2000 Nguyen ................. B82Y 10/00
430/5
8,765,331 B2 * 7/2014 Gallagher ................ G03F 1/24
430/5
(Continued)

FOREIGN PATENT DOCUMENTS

JP 08-062824 * 3/1986 ............... G03F 1/29
JP 01-088551 * 4/1989 ............... G03F 1/00
(Continued)

OTHER PUBLICATIONS

Machine translation of JP 2002-244270 (2002).*

*Primary Examiner* — Martin J Angebranndt
(74) *Attorney, Agent, or Firm* — McClure, Qualey & Rodack, LLP

(57) ABSTRACT

A method for forming a photomask is provided. The method includes forming a light blocking layer over a transparent substrate. The method includes forming a mask layer over the light blocking layer. The mask layer covers a first portion of the light blocking layer, and the first portion is over a second portion of the transparent substrate. The method includes removing the light blocking layer, which is not covered by the mask layer. The method includes removing the mask layer. The first portion of the light blocking layer is removed during removing the mask layer. The method includes removing the second portion of the transparent substrate to form a first recess in the transparent substrate. The method includes forming a first light blocking structure in the first recess.

20 Claims, 32 Drawing Sheets

(51) Int. Cl.
   *G03F 1/58*       (2012.01)
   *G03F 1/72*       (2012.01)
   *G03F 7/20*       (2006.01)
   *H01L 21/027*     (2006.01)

(52) U.S. Cl.
   CPC ........ *G03F 7/2004* (2013.01); *H01L 21/0274* (2013.01)

(56) References Cited

U.S. PATENT DOCUMENTS

| | | | |
|---|---|---|---|
| 9,213,232 B2 * | 12/2015 | Hsu | G03F 1/24 |
| 2004/0151991 A1 * | 8/2004 | Stewart | G03F 1/72 |
| | | | 430/5 |
| 2008/0176150 A1 * | 7/2008 | Saito | G03F 1/26 |
| | | | 430/5 |
| 2018/0284596 A1 * | 10/2018 | Liou | G03F 1/80 |
| 2019/0107773 A1 * | 4/2019 | Chen | G03F 1/36 |

FOREIGN PATENT DOCUMENTS

| | | | | |
|---|---|---|---|---|
| JP | 02-266356 | * | 10/1990 | ............ G03F 1/08 |
| JP | 04-371951 | * | 12/1992 | ............ G03F 1/08 |
| JP | 05-094000 | * | 4/1993 | ............ G03F 1/08 |
| JP | 06-003806 | * | 1/1994 | ............ G03F 1/08 |
| JP | 07-248610 | * | 9/1995 | ............ G03F 1/29 |
| JP | 08-314119 | * | 11/1996 | ............ G03F 1/08 |
| JP | 11-024234 | * | 1/1999 | ............ G03F 1/29 |
| JP | 2002-244270 | * | 8/2002 | ............ G03F 1/20 |
| JP | 2007-219129 | * | 8/2007 | ............ G03F 1/26 |
| JP | 2013-074202 | * | 4/2013 | ............ G03F 1/22 |
| JP | 2015-079914 | * | 4/2015 | ............ G03F 1/24 |

* cited by examiner

METHOD FOR FORMING PHOTOMASK AND PHOTOLITHOGRAPHY METHOD

CROSS REFERENCE TO RELATED APPLICATIONS

This application claims the benefit of U.S. Provisional Application No. 62/591,835, filed on Nov. 29, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component or line that can be created using a fabrication process) has decreased. This scaling-down process generally provides benefits by increasing production efficiency and lowering associated costs.

However, since feature sizes continue to decrease, fabrication processes (e.g. photolithography processes) continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1 to 1E-1 are top views illustrating the photomask of FIGS. 1A-1E, in accordance with some embodiments.

FIGS. 1A-2 to 1E-2 are perspective views illustrating the photomask of FIGS. 1A-1E, in accordance with some embodiments.

FIG. 2 is a cross-sectional view of a photomask, in accordance with some embodiments.

FIG. 8C-1 is a top view of the photomask of FIG. 8C, in accordance with some embodiments.

DETAILED DESCRIPTION

Figure 1A:
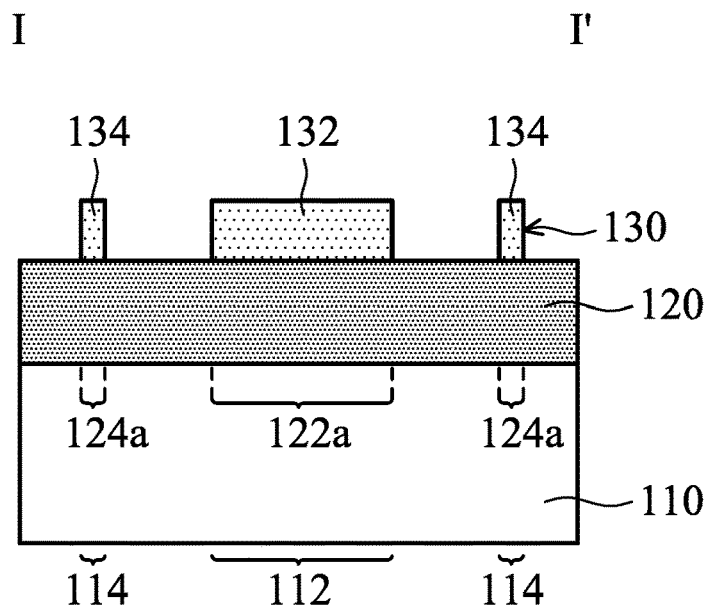
FIGS. 1A-1E are cross-sectional views of various stages of a process for forming a photomask, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Figures 1, 1A:
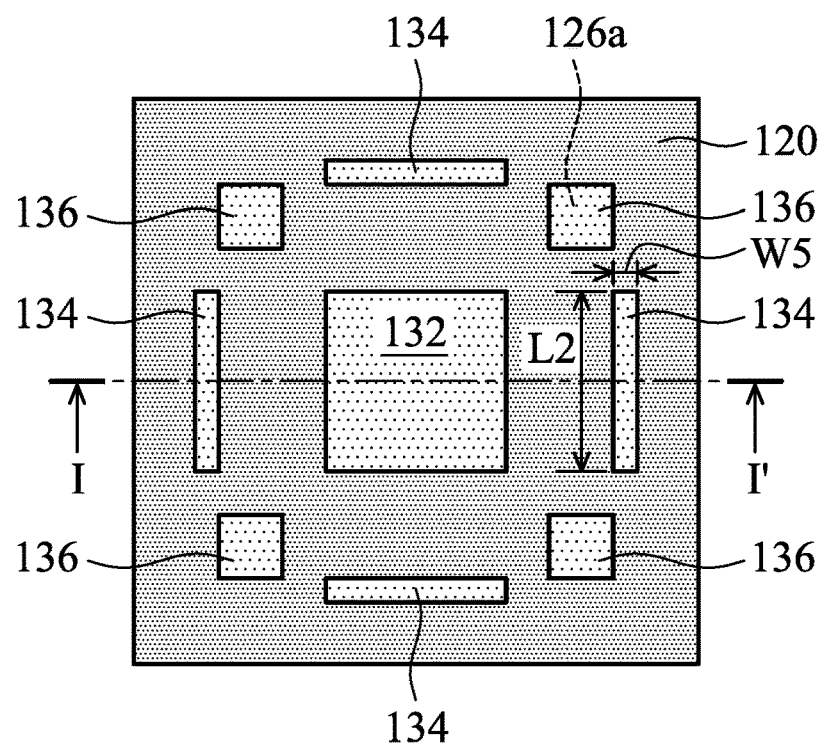
Figures 1, 1A, 2:
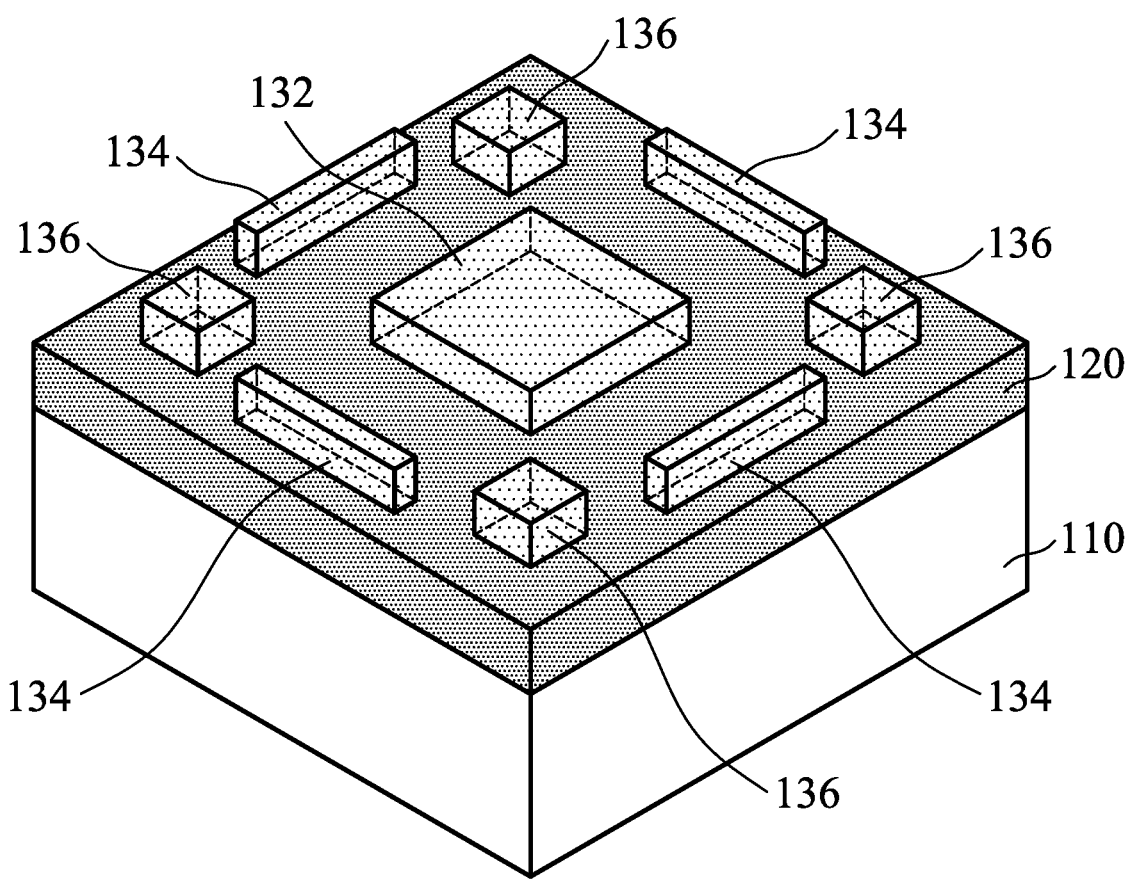
Figure 1B:
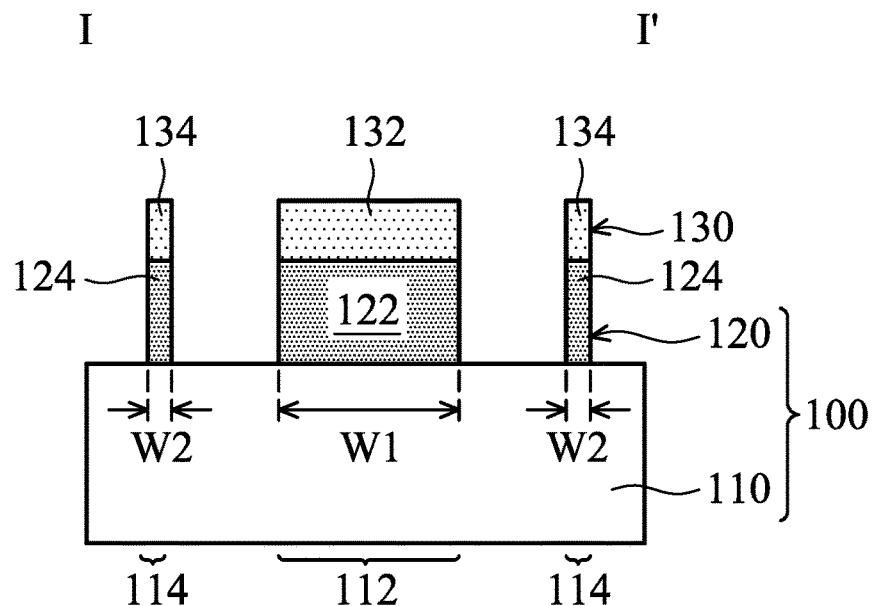
Figures 1, 1B:
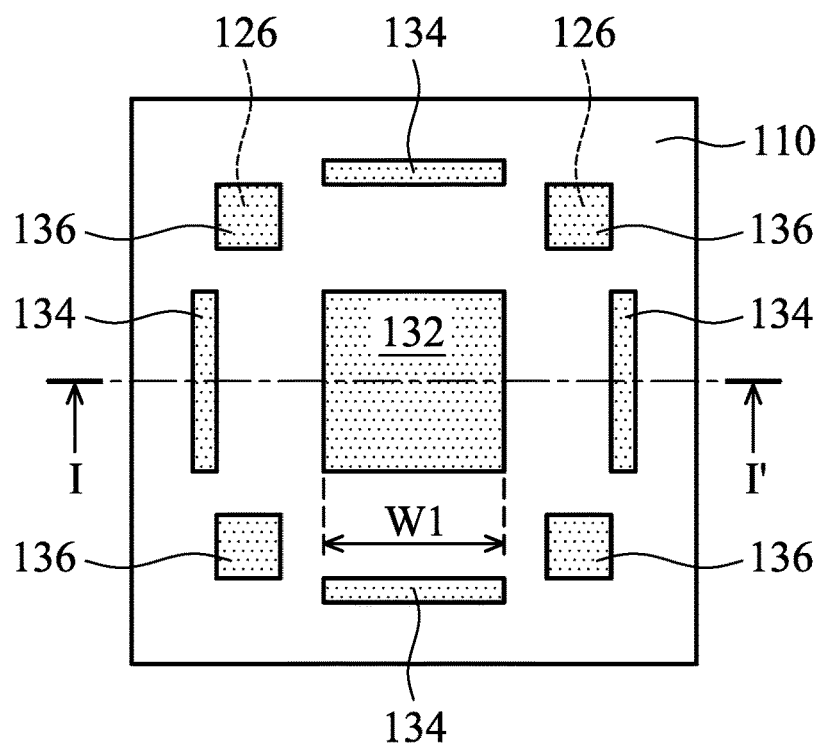
Figures 1, 1B, 2:
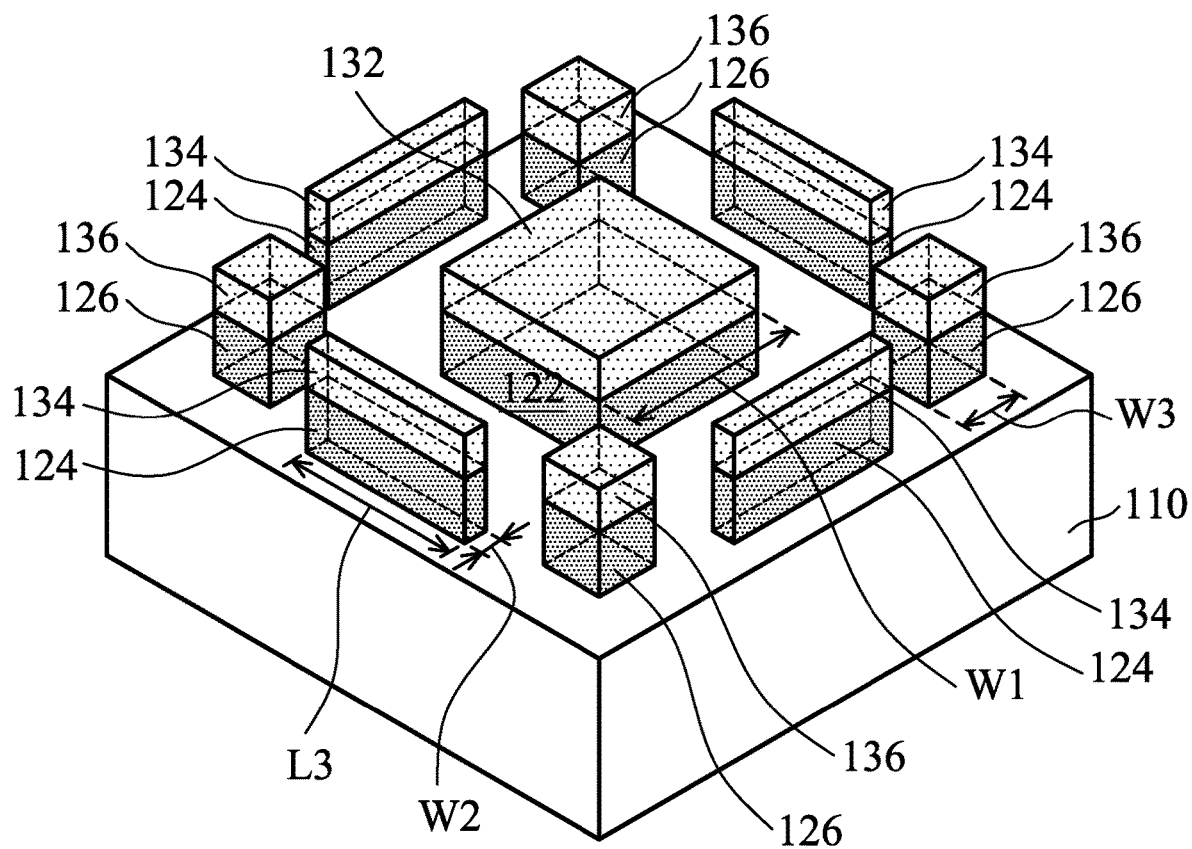
Figure 1C:
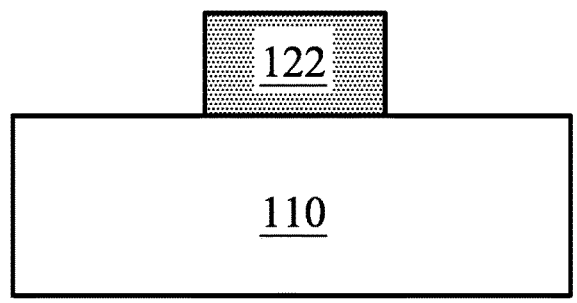
Figures 1, 1C:
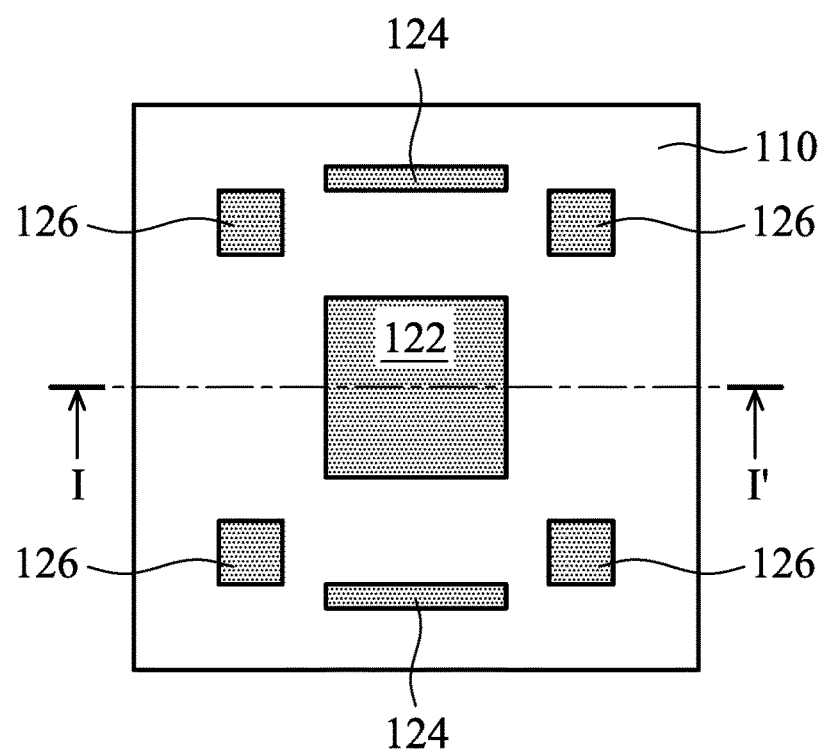
Figures 1, 1C, 2:
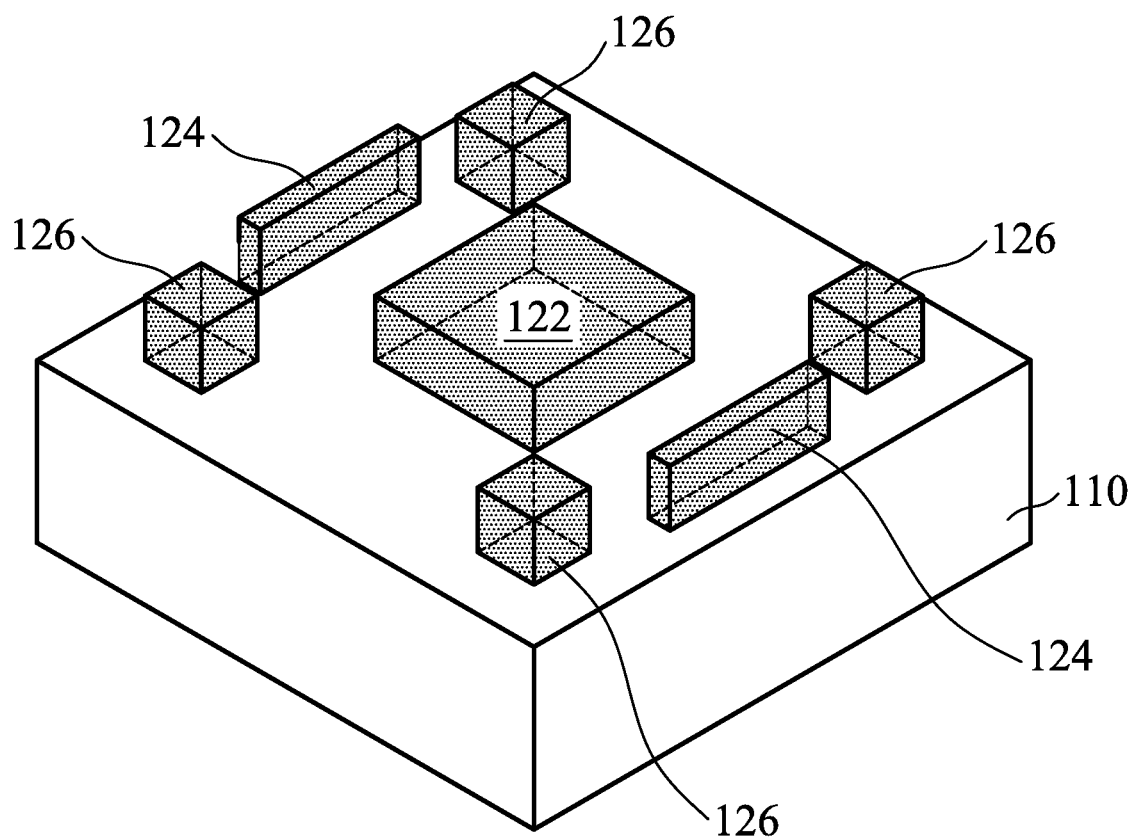
Figure 1D:
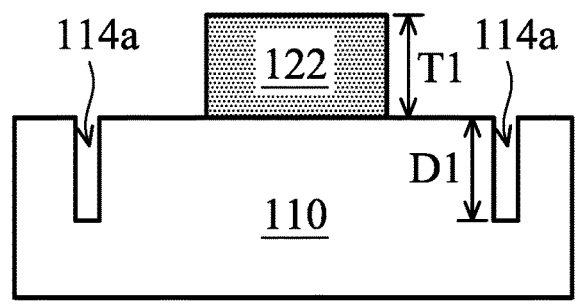
Figures 1, 1D:
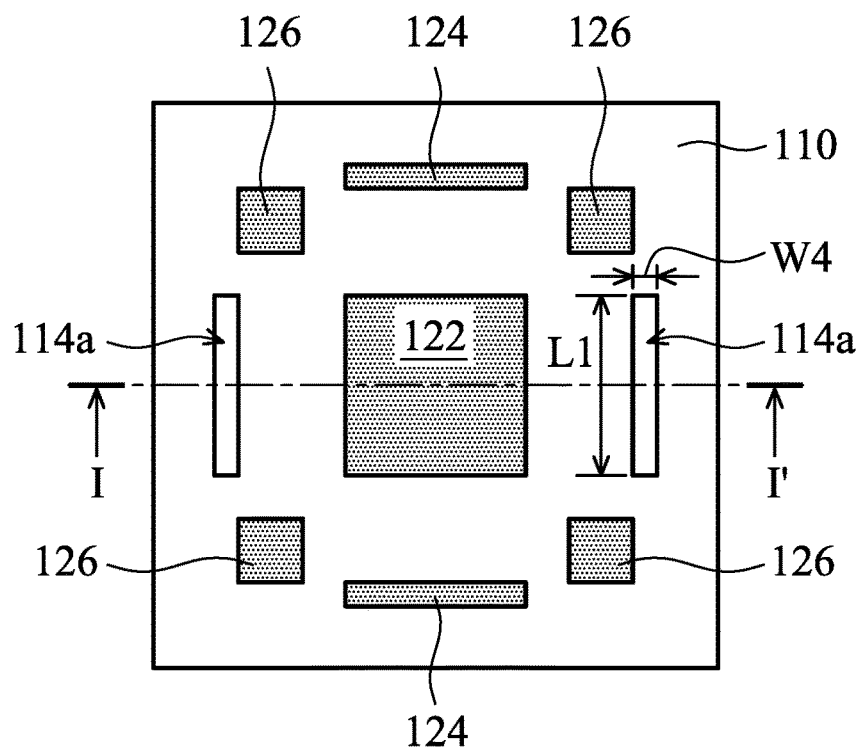
Figures 1, 1D, 2:
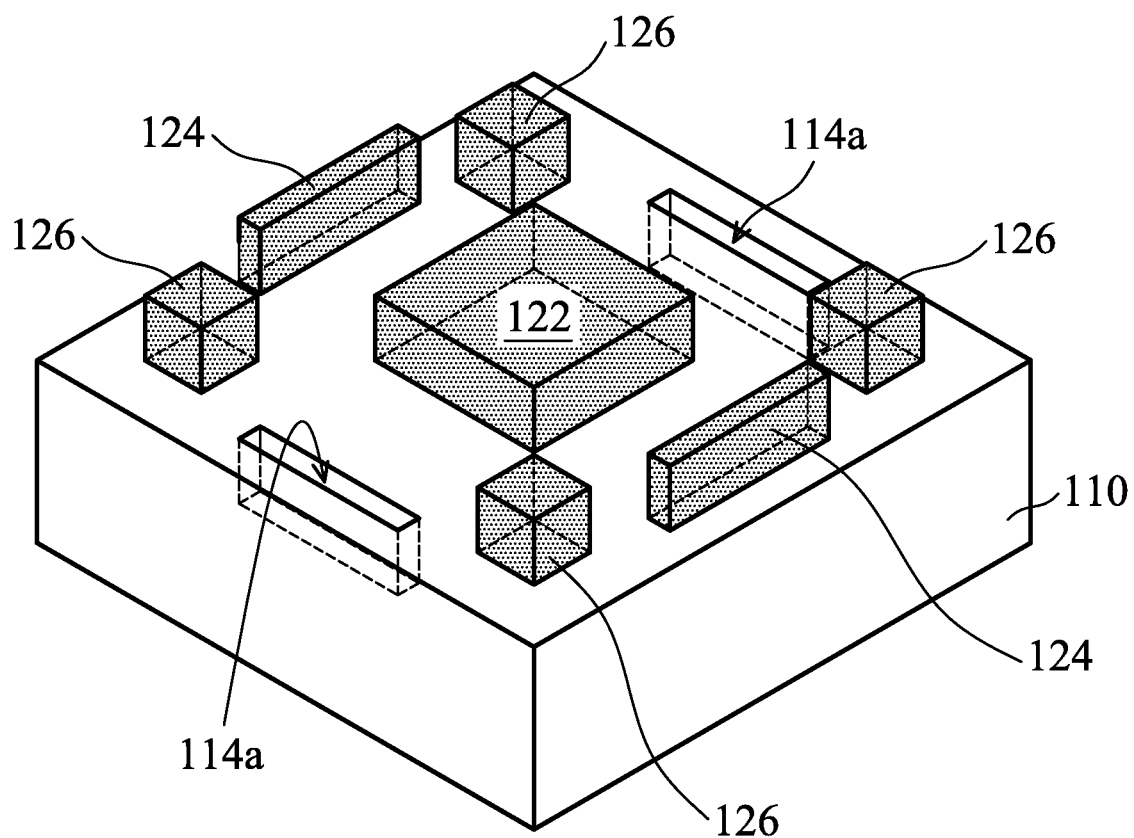
Figure 1E:
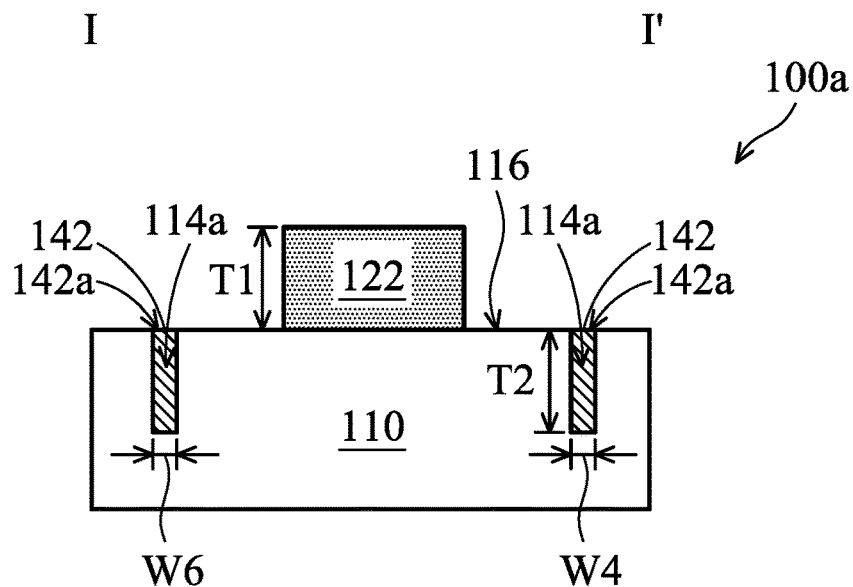
Figures 1, 1E:
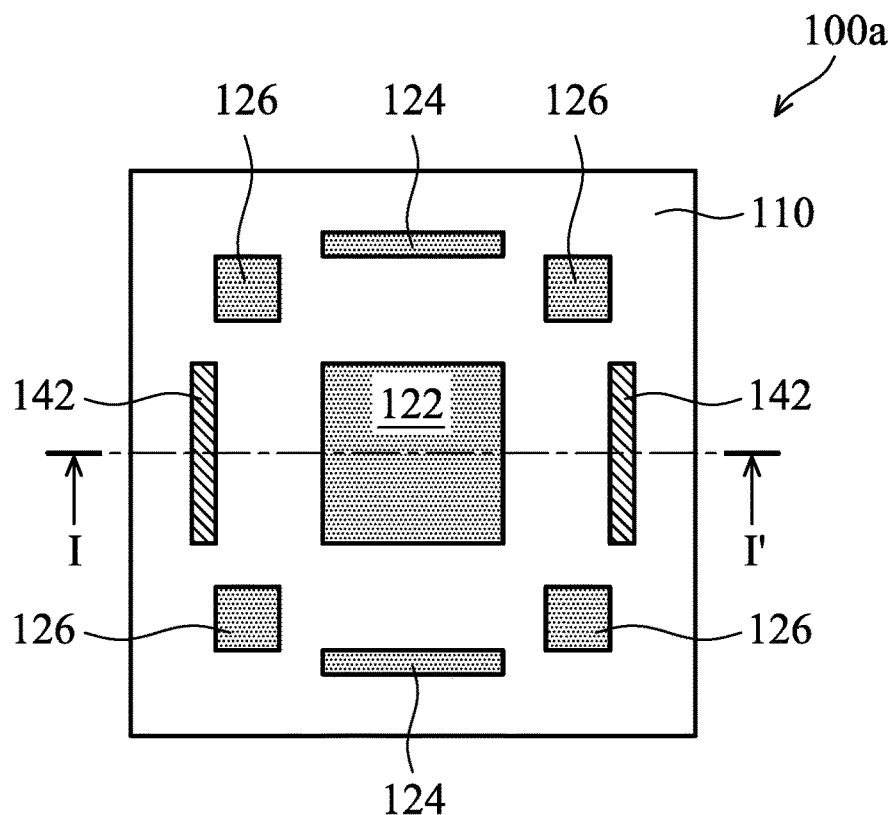
Figures 1, 1E, 2:
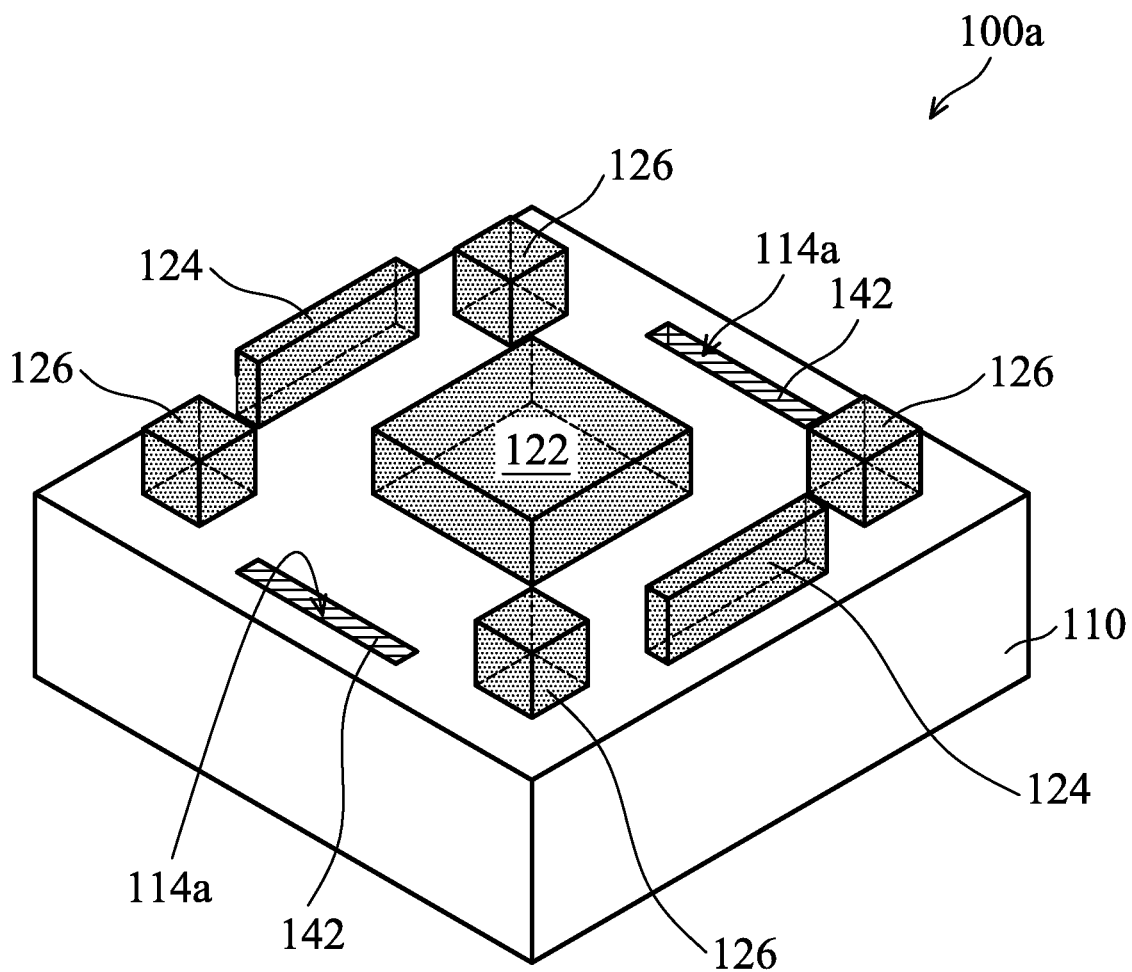
Figure 2:
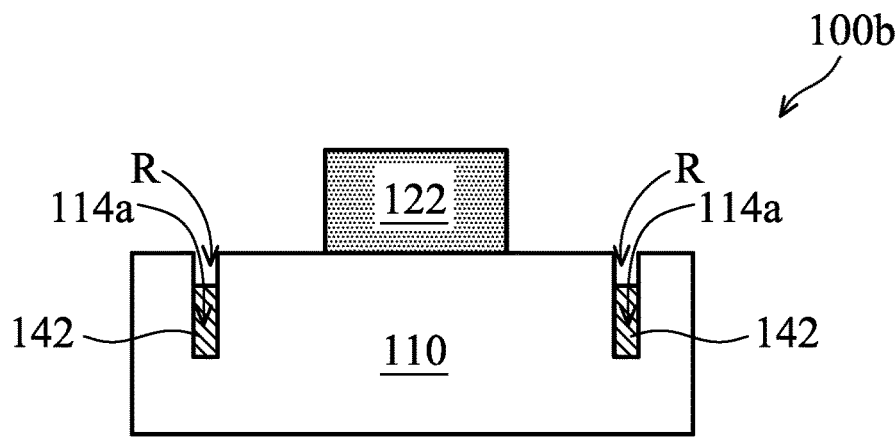

FIGS. 1A-1E are cross-sectional views of various stages of a process for forming a photomask, in accordance with some embodiments. FIGS. 1A-1 to 1E-1 are top views illustrating the photomask of FIGS. 1A-1E, in accordance with some embodiments. FIGS. 1A-1E are cross-sectional views illustrating the photomask along a sectional line I-I' in FIGS. 1A-1 to 1E-1, in accordance with some embodiments. FIGS. 1A-2 to 1E-2 are perspective views illustrating the photomask of FIGS. 1A-1E, in accordance with some embodiments.

As shown in FIGS. 1A, 1A-1, and 1A-2, a transparent substrate 110 is provided, in accordance with some embodiments. The transparent substrate 110 has a transmittance ranging from about 85% to about 100%, in accordance with some embodiments. The transmittance of the transparent substrate 110 ranges from about 95% to about 99.9%, in accordance with some embodiments. The transmittance in the application is measured using a light which is suitable to be used in an exposure operation of a photolithography process, in accordance with some embodiments.

The light includes a G-Line with a wavelength of 436 nm, an I-Line with a wavelength of 365 nm, a KrF excimer laser with a wavelength of 248 nm, a DUV excimer laser with a wavelength of 193 nm, or an EUV light with a wavelength of about 10 nm to 20 nm, particularly about 13.5 nm±0.3 nm, in accordance with some embodiments. The transparent substrate 110 is made of fused silica ($SiO_2$ or fused quartz), calcium fluoride, or another suitable transparent material.

As shown in FIGS. 1A, 1A-1, and 1A-2, a light blocking layer 120 is formed over the transparent substrate 110, in accordance with some embodiments. The light blocking layer 120 has a transmittance ranging from about 0% to about 18%, in accordance with some embodiments. The transmittance ranges from about 0% to about 12%, in accordance with some embodiments. The transmittance ranges from about 0% to about 9%, in accordance with some embodiments. The transmittance ranges from about 0% to about 6%, in accordance with some embodiments.

The light blocking layer 120 is made of an attenuating material or an opaque material, in accordance with some embodiments. The light blocking layer 120 includes chrome or another material, such as metal (e.g., Au, Mo, or Ti, Ta), metal silicide (e.g., MoSi), metal nitride (e.g., CrN, MoN, TiN, ZrN, TaN, or NbN), metal oxide (e.g., $Nb_2O_5$, $MoO_3$, $Cr_2O_3$, $TiO_2$, or $Ta_2O_5$), $Si_3N_4$, $Al_2O_3N$, or a combination thereof, in accordance with some embodiments. The light blocking layer 120 and the transparent substrate 110 are made of different materials, in accordance with some embodiments.

In some embodiments, MoSi allows a small percentage of the light to pass through (typically 6% to 18%). The light blocking layer 120 is formed using a deposition process, such as a physical vapor deposition process or a chemical vapor deposition process, in accordance with some embodiments.

As shown in FIGS. 1A, 1A-1, and 1A-2, a mask layer 130 is formed over the light blocking layer 120, in accordance with some embodiments. The mask layer 130 has a main portion 132 and assist portions 134 and 136, in accordance with some embodiments. The assist portions 134 and 136 alternately surround the main portion 132, in accordance with some embodiments.

In some embodiments, the main portion 132 has a rectangular shape. In some embodiments, the assist portion 134 has a bar shape. In some embodiments, the assist portion 136 has a rectangular shape. As shown in FIG. 1A, the main portion 132 is wider than the assist portion 134, in accordance with some embodiments. As shown in FIGS. 1A-1 and 1A-2, the main portion 132 is wider than the assist portion 136, in accordance with some embodiments.

The main portion 132 covers a portion 122a of the light blocking layer 120, in accordance with some embodiments. The portion 122a is over a portion 112 of the transparent substrate 110, in accordance with some embodiments. The assist portions 134 cover portions 124a of the light blocking layer 120, in accordance with some embodiments.

The portions 124a are over portions 114 of the transparent substrate 110, in accordance with some embodiments. The assist portions 136 cover portions 126a of the light blocking layer 120, in accordance with some embodiments. The portion 122a is wider than the portion 124a, in accordance with some embodiments. The portion 122a is wider than the portion 126a, in accordance with some embodiments.

The mask layer 130 is made of a material different from that of the light blocking layer 120, in accordance with some embodiments. In some embodiments, the mask layer 130 is made of a photoresist material. The mask layer 130 is formed using processes including photoresist deposition, soft baking, mask aligning, exposing (e.g., patterning), baking, developing the photoresist, hard baking, and/or other processes. In some embodiments, the exposing (e.g., patterning) may include electron-beam writing, ion-beam writing, mask-less lithography, and/or molecular imprint.

In some other embodiments, the mask layer 130 is made of a non-photoresist material. The non-photoresist material includes, for example, a metal material (e.g., Cr). The mask layer 130 is formed using a photolithography process and an etching process, in accordance with some embodiments.

As shown in FIGS. 1B, 1B-1, and 1B-2, the light blocking layer 120, which is not covered by the mask layer 130, is removed, in accordance with some embodiments. The portions 122a, 124a, and 126a remain over the transparent substrate 110 after the removal process, in accordance with some embodiments.

The portion 122a forms a main light blocking structure 122, in accordance with some embodiments. The portions 124a and 126a respectively form assist light blocking structures 124 and 126, in accordance with some embodiments. The main light blocking structure 122, the assist light blocking structures 124 and 126, and the transparent substrate 110 together form a photomask 100, in accordance with some embodiments.

As shown in FIG. 1B, a width W1 of the main light blocking structure 122 is greater than a width W2 of the assist light blocking structure 124, in accordance with some embodiments. As shown in FIG. 1B-2, the width W1 is greater than a width W3 of the assist light blocking structure 126, in accordance with some embodiments. The width W3 is greater than the width W2, in accordance with some embodiments.

The assist light blocking structures 124 and 126 are also referred to as sub-resolution assist features, in accordance with some embodiments. The assist light blocking structures 124 and 126 have small dimensions such that the assist light blocking structures 124 and 126 will not image onto a photoresist layer over a semiconductor substrate (e.g., wafer) when the photomask 100 is irradiated during a subsequent exposure operation of a photolithography process. The removal process includes an etching process, such as a dry etching process (e.g., a plasma etching process), in accordance with some embodiments.

As shown in FIGS. 1C, 1C-1, and 1C-2, the mask layer 130 is removed, in accordance with some embodiments. The removal process of the mask layer 130 includes an etching process, such as a wet etching process, in accordance with some embodiments. The removal process of the mask layer 130 may also remove the assist light blocking structures 124. The removal of the assist light blocking structures 124 may be undesirable.

As shown in FIGS. 1D, 1D-1, and 1D-2, the portions 114 of the transparent substrate 110 (as shown in FIG. 1A or 1B) are removed to form recesses 114a in the transparent substrate 110, in accordance with some embodiments. As shown in FIG. 1D-1, a length L1 of the recess 114a is substantially equal to a length L2 of the assist portion 134 of the mask layer 130 (as shown in FIG. 1A-1) or a length L3 of the assist light blocking structure 124 (as shown in FIG. 1B-2), in accordance with some embodiments.

The term "substantially equal to" in the application means "within 10%", in accordance with some embodiments. For example, the term "substantially equal to" means the difference between the lengths L1 and L2 (or L3) is within 10% of the average between the lengths L1 and L2 (or L3), in accordance with some embodiments. The difference may be due to manufacturing processes.

As shown in FIG. 1D-1, a width W4 of the recess 114a is substantially equal to a width W5 of the assist portion 134 of the mask layer 130 (as shown in FIG. 1A-1) or the width W2 of the assist light blocking structure 124 (as shown in FIG. 1B-2), in accordance with some embodiments. The term "substantially equal to" means the difference between the widths W4 and W5 (or W2) is within 10% of the average between the widths W4 and W5 (or W2), in accordance with some embodiments. The difference may be due to manufacturing processes.

In some embodiments, a depth D1 of the recess 114a is substantially equal to a thickness T1 of the main light blocking structure 122. The term "substantially equal to" means the difference between the thickness T1 and the depth D1 is within 10% of the average between the thickness T1 and the depth D1, in accordance with some embodiments. The difference may be due to manufacturing processes.

The portions 114 of the transparent substrate 110 (as shown in FIG. 1A or 1B) are removed using an etching process, a scratch process, or another suitable process. The etching process includes an electron beam-induced etching process, an ion beam-induced etching process, or another suitable process.

As shown in FIGS. 1E, 1E-1, and 1E-2, assist light blocking structures 142 are respectively formed in the recesses 114a, in accordance with some embodiments. In this step, a (repaired) photomask 100a is formed, in accordance with some embodiments. The photomask 100a includes the transparent substrate 110, the main light blocking structure 122, and the assist light blocking structures 124, 126, and 142, in accordance with some embodiments.

In some embodiments, the recesses 114a are completely filled with the assist light blocking structures 142. In some embodiments, a top surface 142a of the assist light blocking structure 142 is substantially aligned with (or substantially coplanar with) a top surface 116 of the transparent substrate 110. The term "substantially coplanar" in the application may include small deviations from coplanar geometries. The deviations may be due to manufacturing processes.

In some embodiments, a thickness T2 of the assist light blocking structure 142 is substantially equal to the thickness T1 of the main light blocking structure 122. The term "substantially equal to" means the difference between the thicknesses T1 and T2 is within 10% of the average thickness between the assist light blocking structure 142 and the main light blocking structure 122, in accordance with some embodiments. The difference may be due to manufacturing processes.

The width W4 of the recess 114a is substantially equal to a width W6 of the assist light blocking structure 142, in accordance with some embodiments. The light blocking layer 120 (as shown in FIG. 1A) and the assist light blocking structures 142 are made of different materials, in accordance with some embodiments. In some other embodiments, the light blocking layer 120 (as shown in FIG. 1A) and the assist light blocking structures 142 are made of the same material.

The assist light blocking structures 142 are made of an attenuating material or an opaque material, in accordance with some embodiments. The assist light blocking structures 142 are made of chrome or other materials, such as metal (e.g., Au, Mo, or Ti, Ta), metal silicide (e.g., MoSi), metal nitride (e.g., CrN, MoN, TiN, ZrN, TaN, or NbN), metal oxide (e.g., $Cr_2O_3$, $Nb_2O_5$, $MoO_3$, $TiO_2$, or $Ta_2O_5$), $Si_3N_4$, $Al_2O_3N$, or a combination thereof, in accordance with some embodiments. The assist light blocking structures 142 and the transparent substrate 110 are made of different materials, in accordance with some embodiments.

The assist light blocking structures 142 are formed using an electron beam-induced deposition process, an ion beam-induced deposition process, or another suitable process. In some embodiments, the recesses 114a and the assist light blocking structures 142 are formed in the same chamber, such as an electron beam chamber or an ion beam chamber.

Since the assist light blocking structures 142 are formed in the recesses 114a, the assist light blocking structures 142 are fixed to the transparent substrate 110 by the recesses 114a, in accordance with some embodiments. Therefore, the assist light blocking structures 142 are prevented from peeling from the transparent substrate 110, in accordance with some embodiments. As a result, the formation of the recesses 114a improves the yield of the process for forming the assist light blocking structures 142, in accordance with some embodiments.

FIG. 2 is a cross-sectional view of a photomask 100b, in accordance with some embodiments. As shown in FIG. 2, the photomask 100b is similar to the photomask 100a of FIG. 1E, except that the recesses 114a of the transparent substrate 110 of the photomask 100b are partially filled with the assist light blocking structures 142, in accordance with some embodiments. In some embodiments, a recess R is surrounded by the assist light blocking structure 142 and the transparent substrate 110, in accordance with some embodiments.

Figure 3:
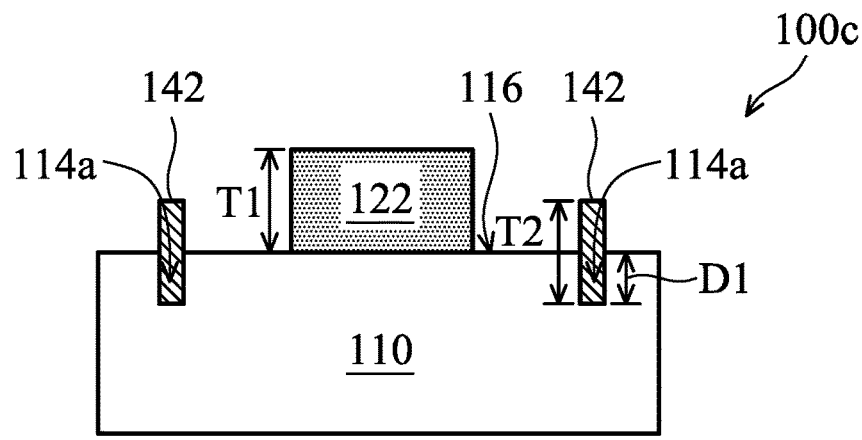
FIG. 3 is a cross-sectional view of a photomask, in accordance with some embodiments.

FIG. 3 is a cross-sectional view of a photomask 100c, in accordance with some embodiments. As shown in FIG. 3, the photomask 100c is similar to the photomask 100a of FIG. 1E, except that the assist light blocking structures 142 of the photomask 100c extend out of the recesses 114a, in accordance with some embodiments. That is, the assist light blocking structures 142 protrude from the top surface 116 of the transparent substrate 110, in accordance with some embodiments.

In some embodiments, the thickness T2 of the assist light blocking structure 142 is substantially equal to the thickness T1 of the main light blocking structure 122. In some embodiments, a ratio of the depth D1 of the recesses 114a to the thickness T1 ranges from about 0.45 to about 0.55.

Figure 4:
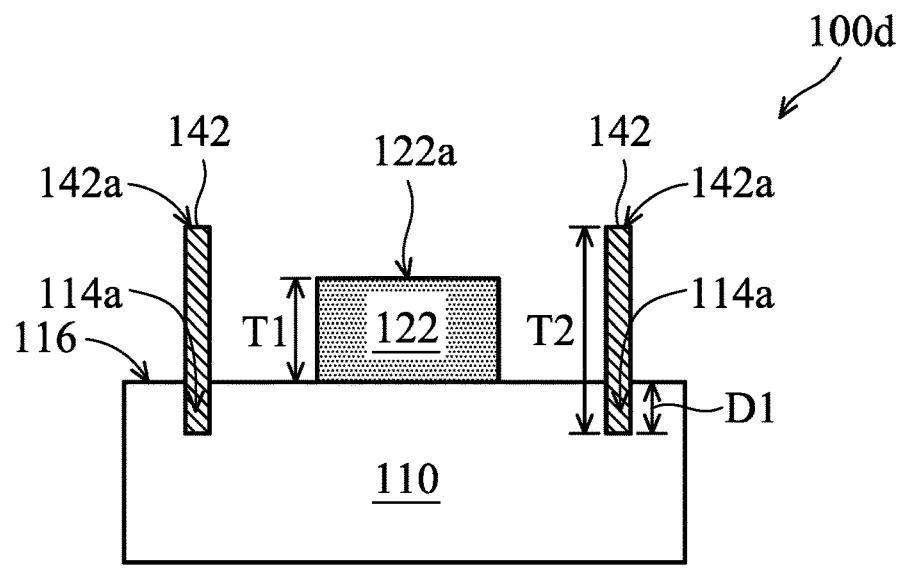
FIG. 4 is a cross-sectional view of a photomask, in accordance with some embodiments.

FIG. 4 is a cross-sectional view of a photomask 100d, in accordance with some embodiments. As shown in FIG. 4, the photomask 100d is similar to the photomask 100c of FIG. 3, except that a ratio of the depth D1 of the recesses 114a to the thickness T1 of the main light blocking structure 122 ranges from about 0.08 to about 0.12.

The top surface 142a of the assist light blocking structure 142 is positioned higher than the top surface 122a of the main light blocking structure 122 relative to the top surface 116 of the transparent substrate 110, in accordance with some embodiments. In some embodiments, the thickness T2 of the assist light blocking structure 142 is greater than the thickness T1 of the main light blocking structure 122.

Figure 5:
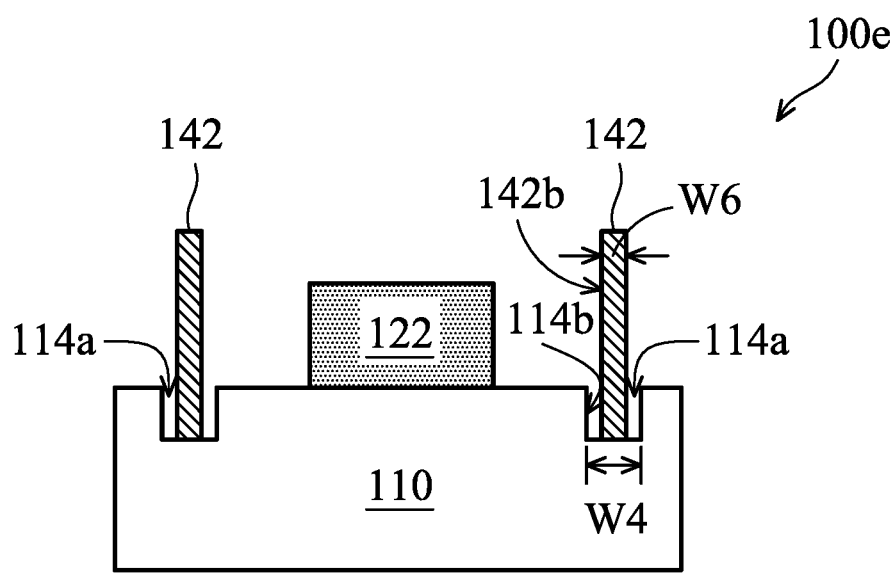
FIG. 5 is a cross-sectional view of a photomask, in accordance with some embodiments.

FIG. 5 is a cross-sectional view of a photomask 100e, in accordance with some embodiments. As shown in FIG. 5, the photomask 100e is similar to the photomask 100d of FIG. 4, except that the width W4 of the recess 114a of the photomask 100e is greater than the width W6 of the assist light blocking structure 142, in accordance with some embodiments. The sidewalls 142b of the assist light blocking structures 142 are spaced apart from the inner walls 114b of the recesses 114a, in accordance with some embodiments.

Figure 6:
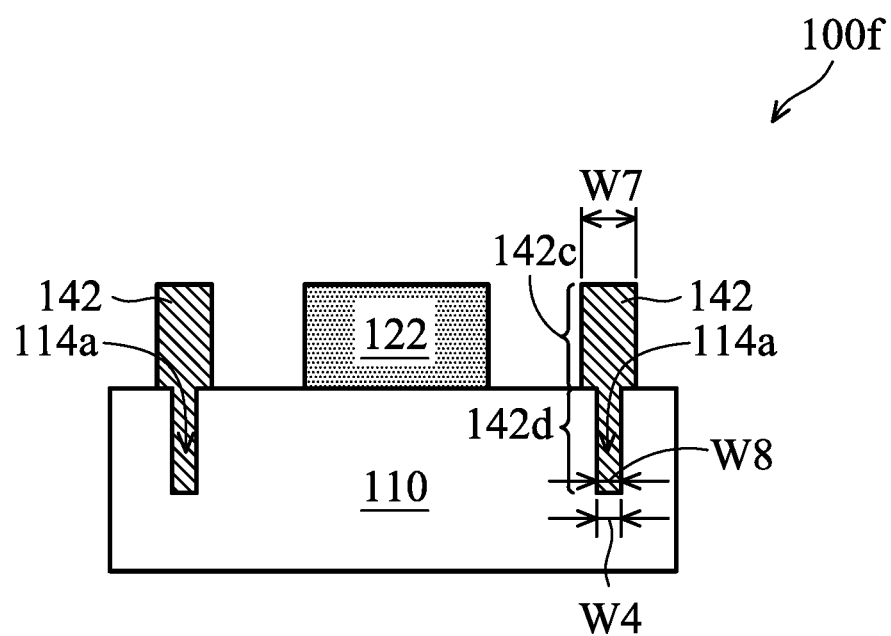
FIG. 6 is a cross-sectional view of a photomask, in accordance with some embodiments.

FIG. 6 is a cross-sectional view of a photomask 100f, in accordance with some embodiments. As shown in FIG. 6, the photomask 100f is similar to the photomask 100d of FIG. 4, except that each of the assist light blocking structures 142 has an upper portion 142c and a lower portion 142d narrower than the upper portion 142c, in accordance with some embodiments.

The upper portion 142c is outside of the recess 114a, in accordance with some embodiments. The lower portion 142d is in the recess 114a, in accordance with some embodiments. In some embodiments, a width W7 of the upper portion 142c is greater than a width W8 of the lower portion 142d. The width W8 is substantially equal to the width W4 of the recess 114a, in accordance with some embodiments. The width W7 is greater than the width W4, in accordance with some embodiments. In some embodiments, a top surface of the main light blocking structure 122 and a top surface of the assist light blocking structure 142 are substantially aligned with or substantially coplanar with each other.

Figure 7A:
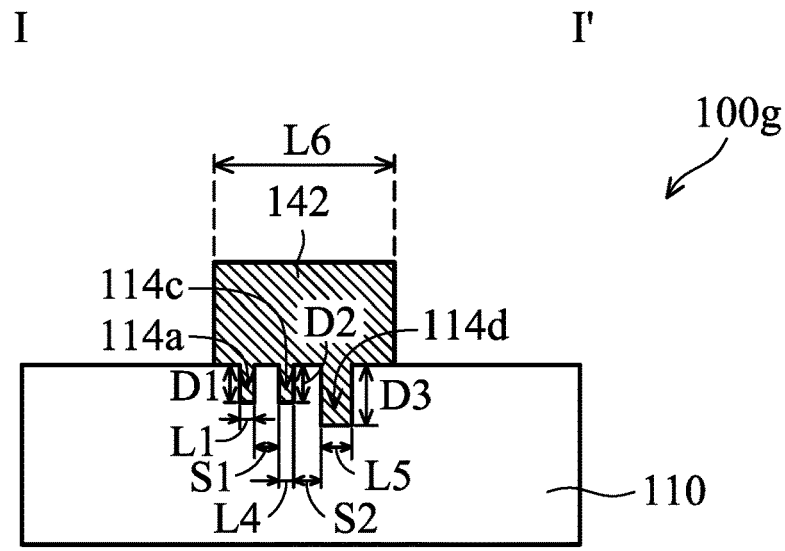
FIG. 7A is a cross-sectional view of a photomask, in accordance with some embodiments.
Figure 7B:
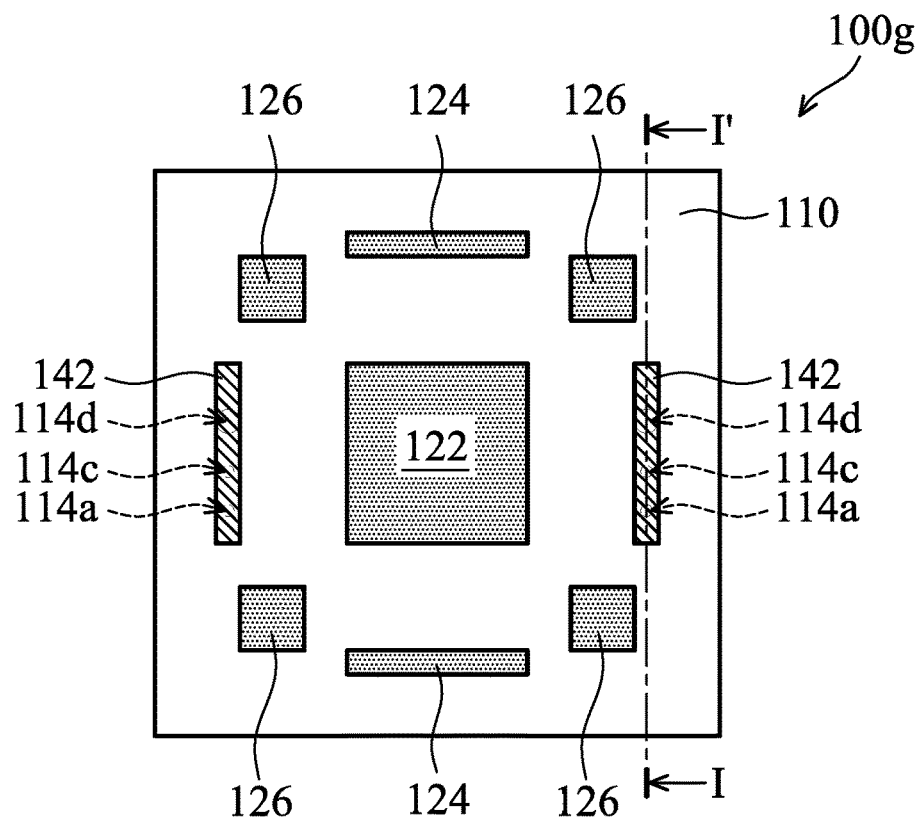
FIG. 7B is a top view illustrating the photomask of FIG. 7A, in accordance with some embodiments.

FIG. 7A is a cross-sectional view of a photomask 100g, in accordance with some embodiments. FIG. 7B is a top view illustrating the photomask 100g of FIG. 7A, in accordance with some embodiments. FIG. 7A is a cross-sectional views illustrating the photomask 100g along a sectional line I-I' in FIG. 7B, in accordance with some embodiments.

As shown in FIGS. 7A and 7B, the photomask 100g is similar to the photomask 100f of FIG. 6, except that the transparent substrate 110 of the photomask 100g further has recesses 114c and 114d, and the assist light blocking structure 142 further extends into the recesses 114c and 114d, in accordance with some embodiments.

The recesses 114a, 114c and 114d are spaced apart from each other, in accordance with some embodiments. In some embodiments, a distance S1 between the recesses 114a and 114c is substantially equal to a distance S2 between the recesses 114c and 114d. In some other embodiments, the distance S1 is different from the distance S2.

The length L1 of the recess 114a, the length L4 of the recess 114c, or the length L5 of the recess 114d is less than the length L2 of the assist portion 134 of the mask layer 130 (as shown in FIG. 1A-1) or the length L6 of the assist light blocking structures 142, in accordance with some embodiments.

The length L1 of the recess 114a, the length L4 of the recess 114c, and the length L5 of the recess 114d are different from each other, in accordance with some embodiments. In some other embodiments, the lengths L1, L4, and L5 are substantially equal to each other.

The depth D1 of the recess 114a, the depth D2 of the recess 114c, and the depth D3 of the recess 114d are different from each other, in accordance with some embodiments. In some other embodiments, the depths D1, D2, and D3 are substantially equal to each other.

Figure 8A:
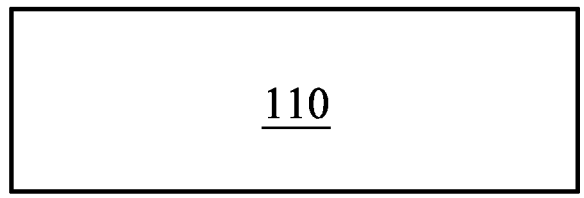
FIGS. 8A-8C are cross-sectional views of various stages of a process for forming a photomask, in accordance with some embodiments.
Figure 8B:
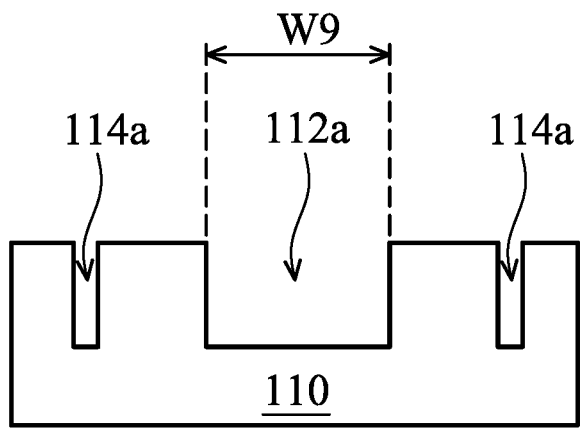
Figure 8C:
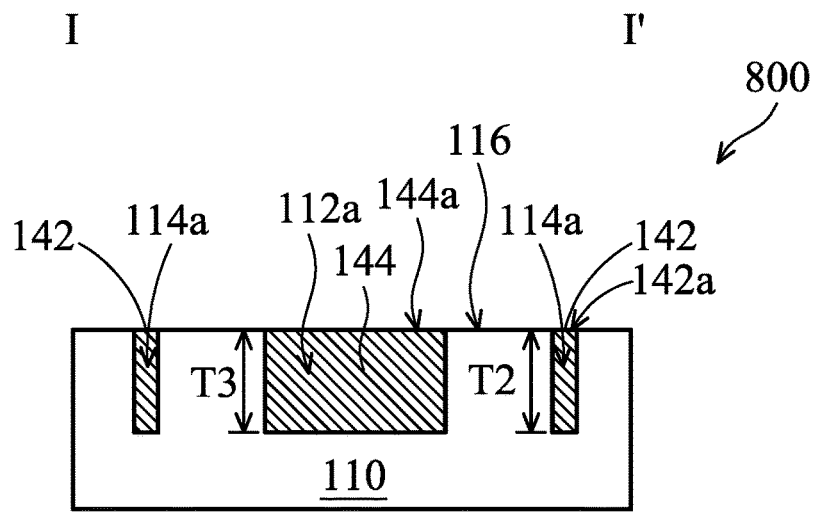
Figures 1, 8C:
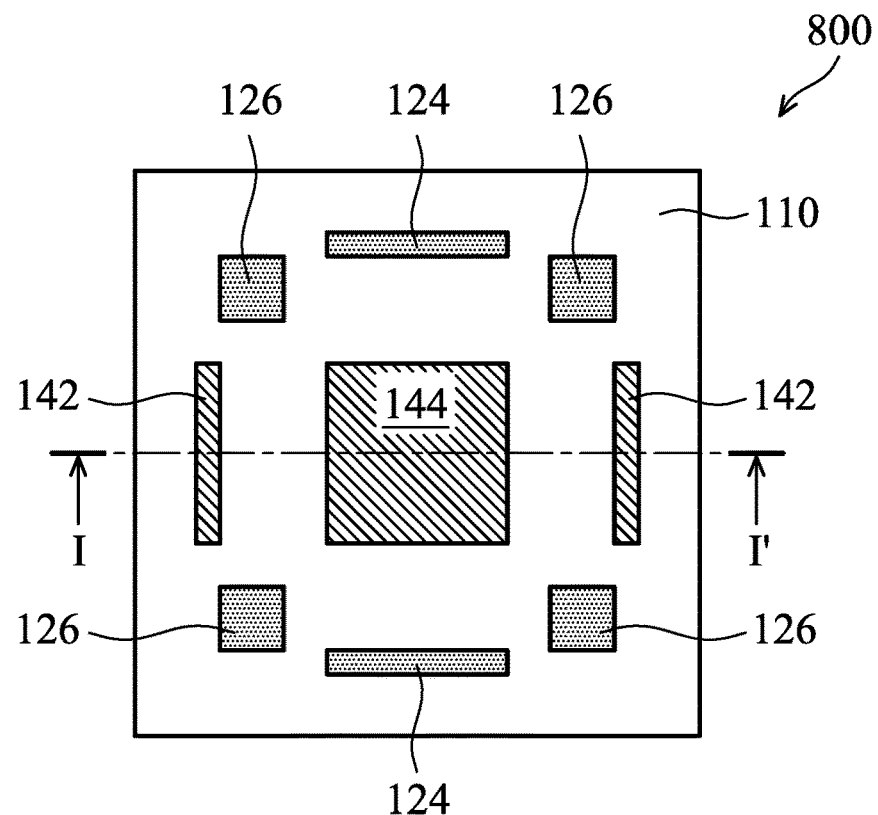

FIGS. 8A-8C are cross-sectional views of various stages of a process for forming a photomask, in accordance with some embodiments. As shown in FIG. 8A, after the step of FIG. 1B, the mask layer 130 is removed, in accordance with some embodiments. The removal process of the mask layer 130 may also remove the assist light blocking structures 124 and the main light blocking structure 122. The removal process of the mask layer 130 includes an etching process, such as a wet etching process, in accordance with some embodiments.

As shown in FIG. 8B, the portions 112 and 114 of the transparent substrate 110 (as shown in FIG. 1A) are removed to form recesses 112a and 114a in the transparent substrate 110, in accordance with some embodiments. In some embodiments, a width W9 of the recess 112a is substantially equal to the width W1 of the main light blocking structure 122 (as shown in FIG. 1B).

The portions 112 and 114 of the transparent substrate 110 (as shown in FIG. 1A or 1B) are removed using an etching process, a scratch process, or another suitable process. The etching process includes an electron beam-induced etching process, an ion beam-induced etching process, or another suitable process.

As shown in FIG. 8C, a main light blocking structure 144 and assist light blocking structures 142 are respectively formed in the recesses 112a and 114a, in accordance with some embodiments. The main light blocking structure 144 is made of an attenuating material or an opaque material, in accordance with some embodiments.

The main light blocking structure 144 is made of chrome or other materials, such as metal (e.g., Au, Mo, or Ti, Ta), metal silicide (e.g., MoSi), metal nitride (e.g., CrN, MoN, TiN, ZrN, TaN, or NbN), metal oxide (e.g., $Cr_2O_3$, $Nb_2O_5$, $MoO_3$, $TiO_2$, or $Ta_2O_5$), $Si_3N_4$, $Al_2O_3N$, or a combination thereof, in accordance with some embodiments. The main light blocking structure 144 and the assist light blocking structures 142 are made of the same material, in accordance with some embodiments. In this step, a (repaired) photomask 800 is formed, in accordance with some embodiments.

FIG. 8C-1 is a top view of the photomask 800 of FIG. 8C, in accordance with some embodiments. FIG. 8C is a cross-sectional views illustrating the photomask 800 along a sectional line I-I' in FIG. 8C-1, in accordance with some embodiments. As shown in FIGS. 8C and 8C-1, the photomask 800 includes the transparent substrate 110, the assist light blocking structures 126, 124 and 142, and the main light blocking structure 144, in accordance with some embodiments.

In some embodiments, the recesses 114*a* are completely filled with the assist light blocking structures 142. In some embodiments, a top surface 142*a* of the assist light blocking structure 142, a top surface 144*a* of the main light blocking structure 144, and a top surface 116 of the transparent substrate 110 are substantially aligned with or substantially coplanar with each other.

In some embodiments, the thickness T2 of the assist light blocking structure 142 is substantially equal to the thickness T3 of the main light blocking structure 144. The term "substantially equal to" means the difference between the thicknesses T2 and T3 is within 10% of the average thickness between the assist light blocking structure 142 and the main light blocking structure 144, in accordance with some embodiments. The difference may be due to manufacturing processes.

Figure 9:
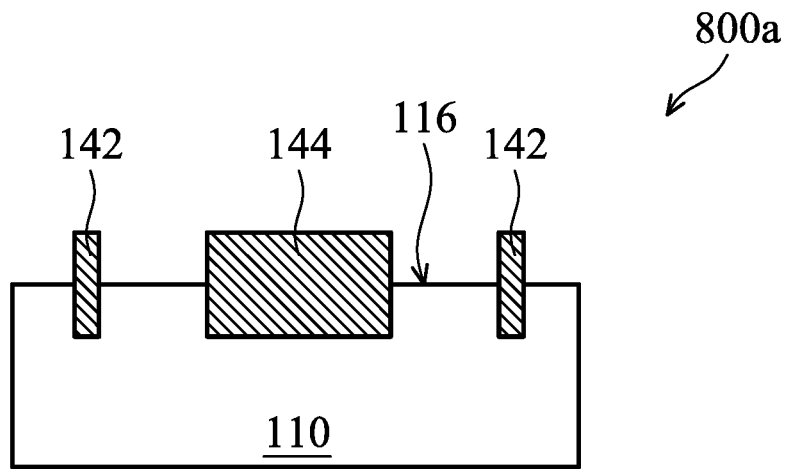
FIG. 9 is a cross-sectional view of a photomask, in accordance with some embodiments.

FIG. 9 is a cross-sectional view of a photomask 800*a*, in accordance with some embodiments. As shown in FIG. 9, the photomask 800*a* is similar to the photomask 800 of FIG. 8C, except that the assist light blocking structure 142 and the main light blocking structure 144 protrude from the top surface 116 of the transparent substrate 110, in accordance with some embodiments.

Figure 10:
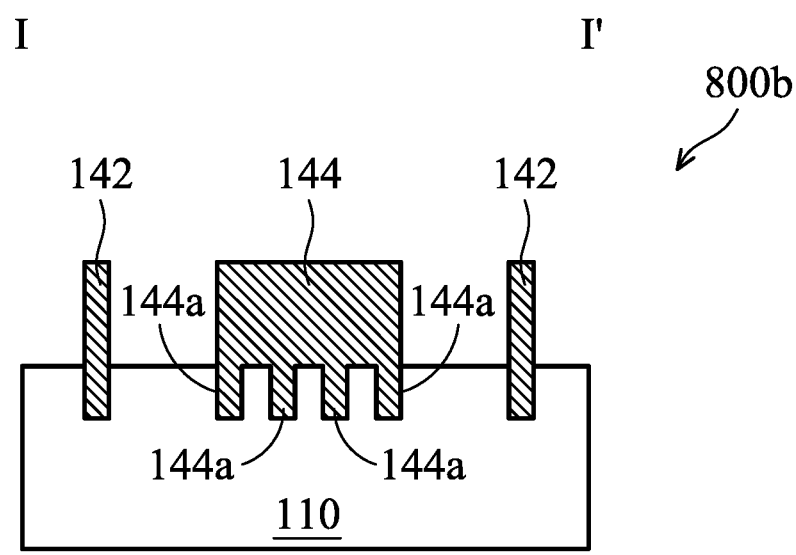
FIG. 10 is a cross-sectional view of a photomask, in accordance with some embodiments.

FIG. 10 is a cross-sectional view of a photomask 800*b*, in accordance with some embodiments. As shown in FIG. 10, the photomask 800*b* is similar to the photomask 800*a* of FIG. 9, except that main light blocking structure 144 has extending portions 144*a* extending into the transparent substrate 110, in accordance with some embodiments.

The extending portions 144*a* are spaced apart from each other, in accordance with some embodiments. The extending portions 144*a* are spaced apart from each other by the same distance, in accordance with some embodiments. In some other embodiments, the extending portions 144*a* are spaced apart from each other by different distances. In some embodiments, the extending portions 144*a* are substantially parallel to each other.

Figure 10A:
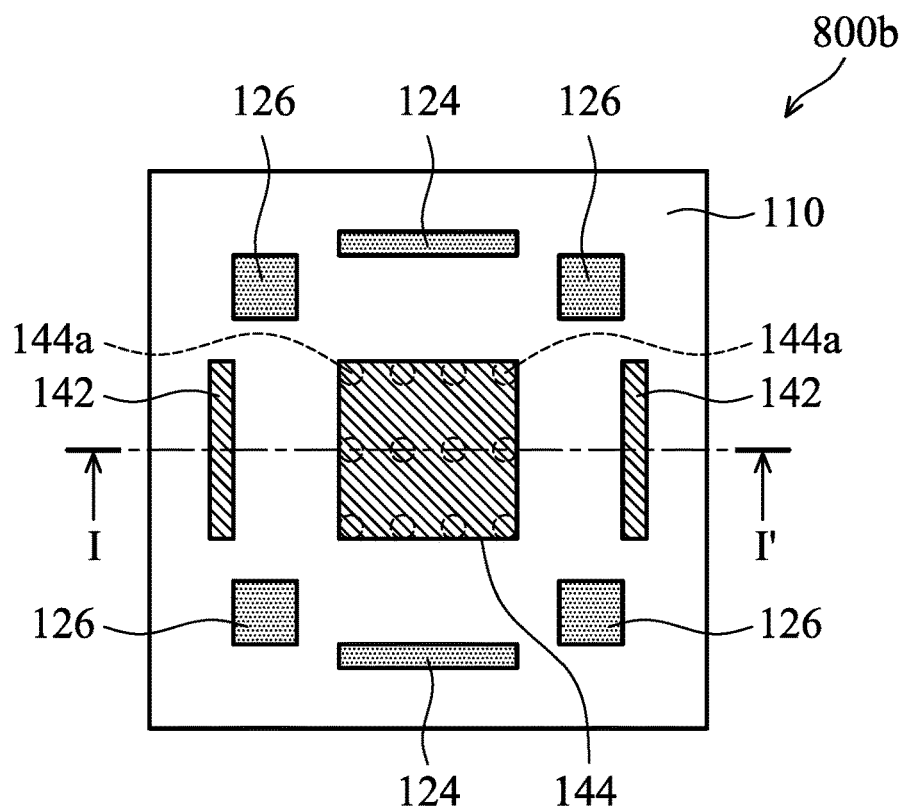
FIG. 10A is a top view of the photomask of FIG. 10, in accordance with some embodiments.

FIG. 10A is a top view of the photomask 800*b* of FIG. 10, in accordance with some embodiments. FIG. 10 is a cross-sectional views illustrating the photomask 800*b* along a sectional line I-I' in FIG. 10A, in accordance with some embodiments. As shown in FIGS. 10 and 10A, the extending portions 144*a* have a pillar shape, in accordance with some embodiments. The extending portions 144*a* are cylindrical pillars, in accordance with some embodiments.

Figure 10B:
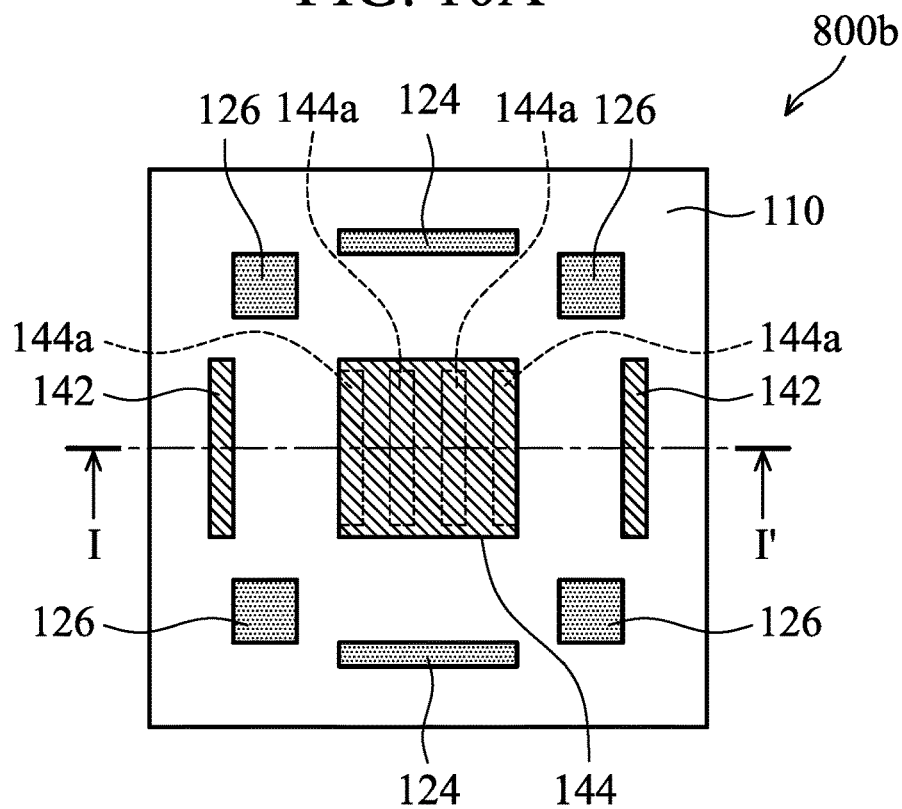
FIG. 10B is a top view of the photomask of FIG. 10, in accordance with some embodiments.

FIG. 10B is a top view of the photomask 800*b* of FIG. 10, in accordance with some embodiments. FIG. 10 is a cross-sectional views illustrating the photomask 800*b* along a sectional line I-I' in FIG. 10B, in accordance with some embodiments. As shown in FIGS. 10 and 10B, the extending portions 144*a* have a rectangular shape, in accordance with some embodiments. The extending portions 144*a* have a sheet shape, in accordance with some embodiments.

Figure 11:
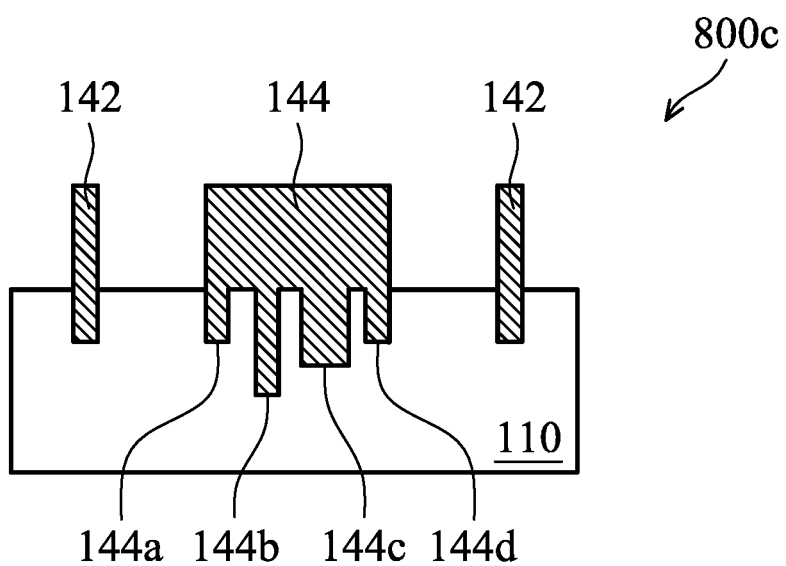
FIG. 11 is a cross-sectional view of a photomask, in accordance with some embodiments.

FIG. 11 is a cross-sectional view of a photomask 800*c*, in accordance with some embodiments. As shown in FIG. 11, the photomask 800*c* is similar to the photomask 800*b* of FIG. 10, except that main light blocking structure 144 has extending portions 144*a*, 144*b*, 144*c* and 144*d* extending into the transparent substrate 110, in accordance with some embodiments.

The extending portions 144*a*, 144*b*, 144*c* and 144*d* have different widths, in accordance with some embodiments. The extending portions 144*a*, 144*b*, 144*c* and 144*d* are spaced apart from each other by different distances, in accordance with some embodiments.

Figure 12A:
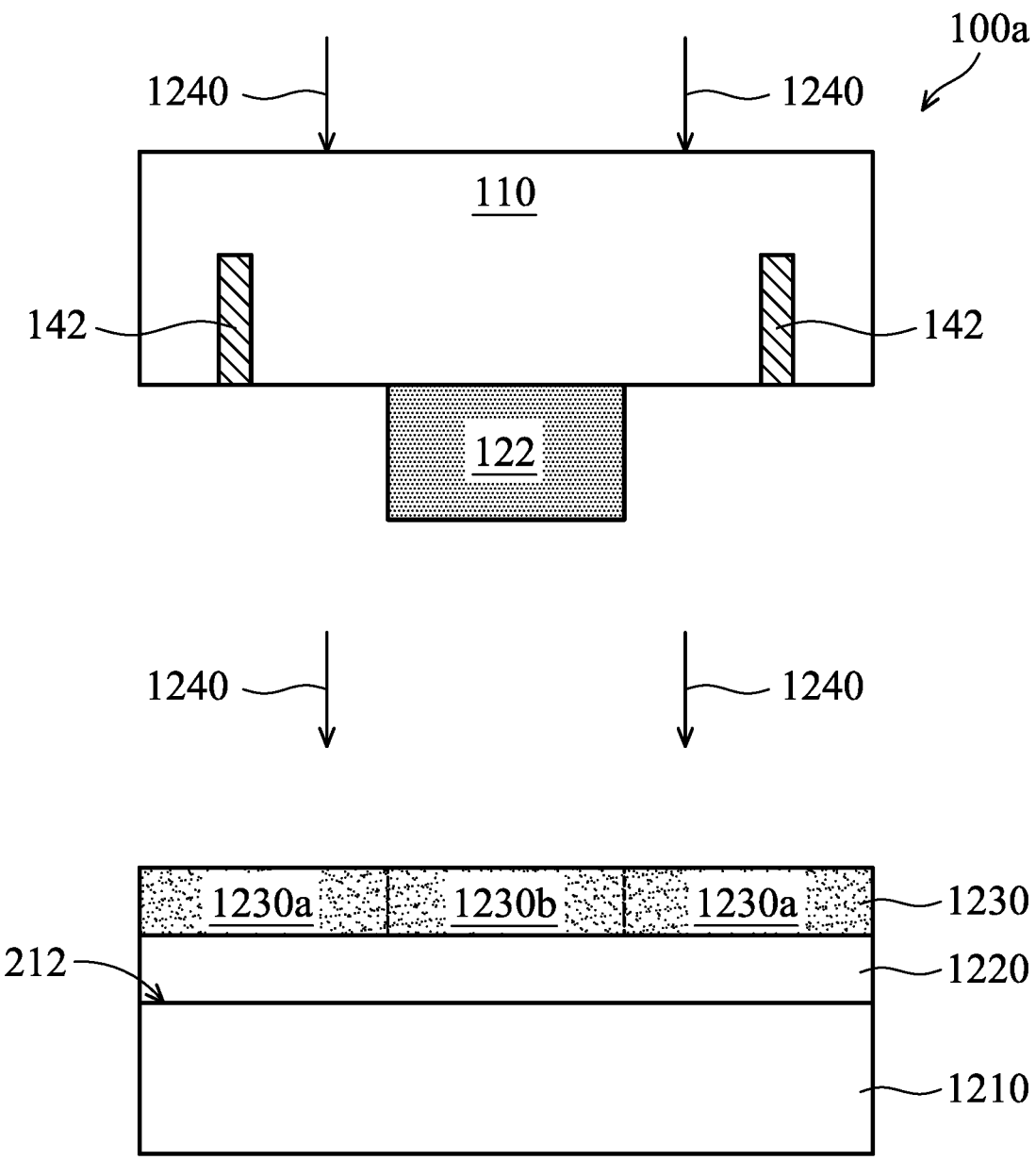
FIGS. 12A-12D are cross-sectional views of various stages of a process for forming a semiconductor device structure, in accordance with some embodiments.

FIGS. 12A-12D are cross-sectional views of various stages of a process for forming a semiconductor device structure, in accordance with some embodiments. As shown in FIG. 12A, a substrate 1210 is provided, in accordance with some embodiments. The substrate 1210 has a surface 1212, in accordance with some embodiments. In some embodiments, the substrate 1210 is a bulk semiconductor substrate, such as a semiconductor wafer. For example, the substrate 1210 is a silicon wafer.

The substrate 1210 may include silicon or another elementary semiconductor material such as germanium. In some other embodiments, the substrate 1210 includes a compound semiconductor. The compound semiconductor may include silicon germanium, gallium arsenide, silicon carbide, indium arsenide, indium phosphide, another suitable compound semiconductor, or a combination thereof.

In some embodiments, the substrate 1210 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the substrate 1210. The device elements are not shown in figures for the purpose of simplicity and clarity. Examples of the various device elements include transistors, diodes, another suitable element, or a combination thereof.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 1210. The isolation features are used to define active regions and electrically isolate various device elements formed in and/or over the substrate 1210 in the active regions. In some embodiments, the isolation features include shallow trench isolation (STI) features, local oxidation of silicon (LOCOS) features, other suitable isolation features, or a combination thereof.

As shown in FIG. 12A, a layer 1220 is formed over the surface 1212 of the substrate 1210, in accordance with some embodiments. The layer 1220 is a single-layer structure or a multi-layer structure, in accordance with some embodiments. The layer 1220 is made of an insulating material, in accordance with some embodiments.

The insulating material includes silicon nitride, silicon oxide, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof. The layer 1220 is formed using a chemical vapor deposition process, a spin coating process, or another suitable process.

In some other embodiments, the layer 1220 is made of a conductive material. The conductive material includes metal, such as copper, aluminum, tungsten, gold, silver, or a combination thereof, in accordance with some embodiments. The layer 1220 is formed using a physical vapor deposition process, a plating process, or another suitable process.

As shown in FIG. 12A, a photoresist layer 1230 is formed over the layer 1220, in accordance with some embodiments. As shown in FIG. 12A, the photomask 100*a* of FIG. 1E is positioned over the photoresist layer 1230, in accordance with some embodiments. The photomask 100*a* may be replaced with the photomask 100*b*, 100*c*, 100*d*, 100*e*, 100*f*, 100*g*, 800, 800*a*, 800*b*, or 800*c* of FIG. 2, 3, 4, 5, 6, 7A, 8C, 9, 10, or 11.

As shown in FIG. 12A, an exposure process is performed, in accordance with some embodiments. During the exposure process, the photomask 100*a* is irradiated by a light 1240, in accordance with some embodiments. The light 1240 passes through the transparent substrate 110 and irradiates a portion 1230*a* of the photoresist layer 1230, in accordance with some embodiments. The photoresist layer 1230 has a portion 1230*b*, which is not irradiated by the light 1240, in accordance with some embodiments.

Figure 12B:
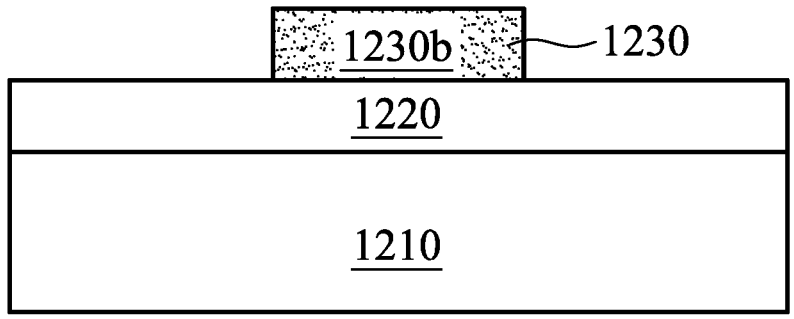

As shown in FIG. 12B, if the photoresist layer 1230 is made of a positive photoresist, the portion 1230*a* is removed, in accordance with some embodiments. The removal process includes a develop process, in accordance with some embodiments. The positive photoresist includes phenol-formaldehyde (novolak) resin, epoxy resin, or another suitable material.

Figure 12C:
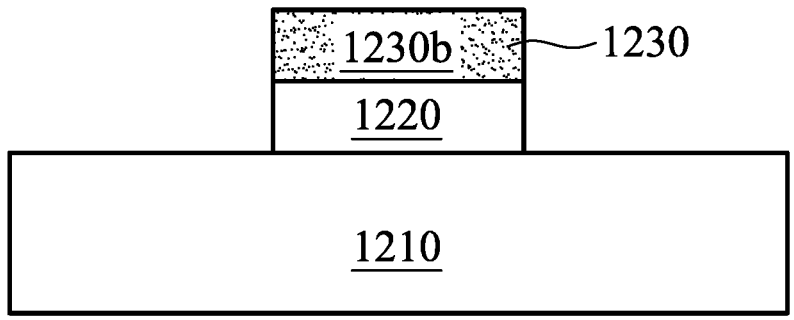
Figure 12D:
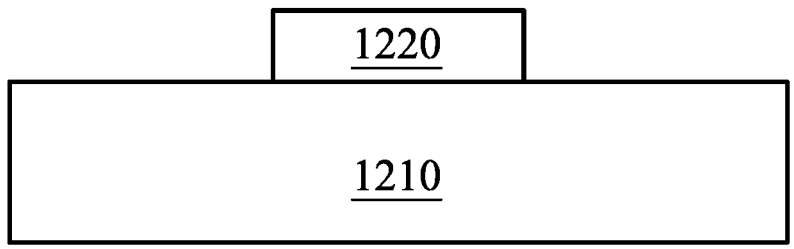

As shown in FIG. 12C, portions of the layer 1220, which are not covered by the photoresist layer 1230, are removed, in accordance with some embodiments. The removal process includes an etching process, such as a dry etching process, in accordance with some embodiments. As shown in FIG. 12D, the photoresist layer 1230 is removed, in accordance with some embodiments.

Figure 13A:
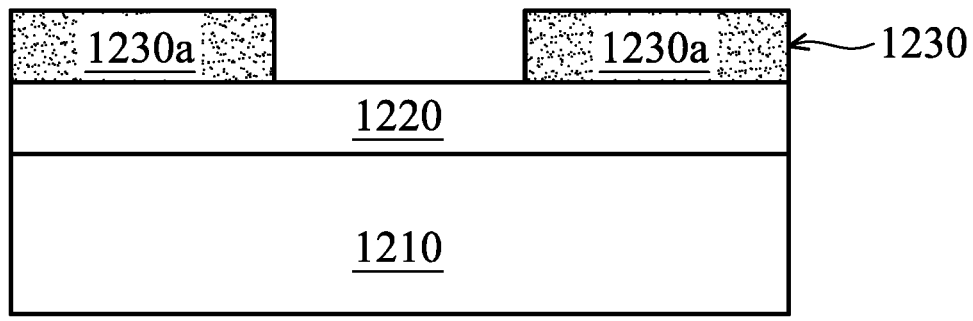
FIGS. 13A-13C are cross-sectional views of various stages of a process for forming a semiconductor device structure, in accordance with some embodiments.
Figure 13B:
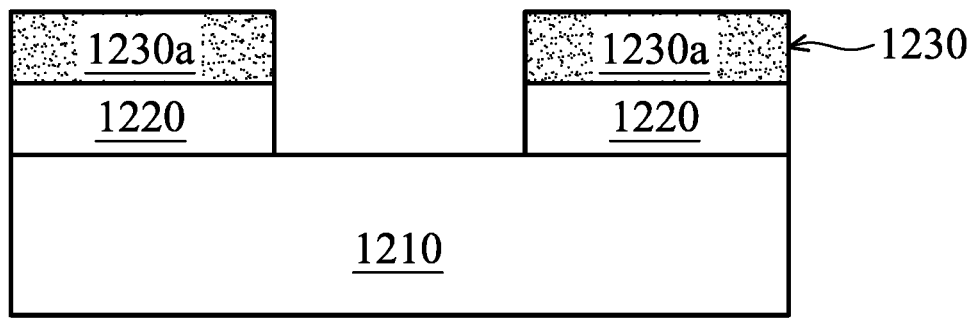
Figure 13C:
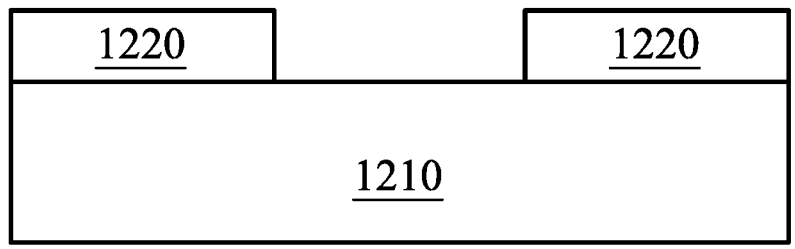

FIGS. 13A-13C are cross-sectional views of various stages of a process for forming a semiconductor device structure, in accordance with some embodiments. As shown in FIG. 13A, after the step of FIG. 12A, if the photoresist layer 1230 is made of a negative photoresist, the portion 1230*b* is removed, in accordance with some embodiments. The removal process includes a develop process, in accordance with some embodiments. The negative photoresist includes polyisoprene or another suitable material.

As shown in FIG. 13B, portions of the layer 1220, which are not covered by the photoresist layer 1230, are removed, in accordance with some embodiments. The removal process includes an etching process, such as a dry etching process, in accordance with some embodiments. As shown in FIG. 13C, the photoresist layer 1230 is removed, in accordance with some embodiments.

Figure 14A:
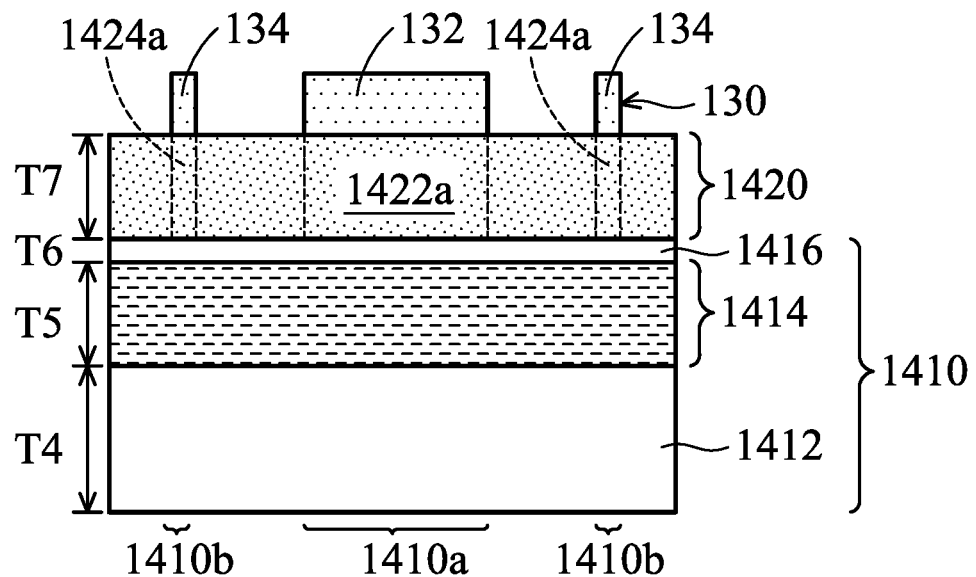
FIGS. 14A-14E are cross-sectional views of various stages of a process for forming a photomask, in accordance with some embodiments.

FIGS. 14A-14E are cross-sectional views of various stages of a process for forming a photomask, in accordance with some embodiments. As shown in FIG. 14A, a reflective substrate 1410 is provided, in accordance with some embodiments. The reflective substrate 1410 has a reflectivity ranging from about 50% to about 100%, in accordance with some embodiments. The reflectivity of the reflective substrate 1410 ranges from about 65% to about 75%, in accordance with some embodiments.

The reflectivity in the application is measured using a light which is suitable to be used in an exposure operation of a photolithography process, in accordance with some embodiments. The light includes an EUV light with a wavelength of about 10 nm to 20 nm, particularly about 13.5 nm±0.3 nm, in accordance with some embodiments.

The reflective substrate 1410 includes a substrate 1412, a reflective layer 1414, and an adhesive layer 1416, in accordance with some embodiments. The substrate 1412 is made of fused silica ($SiO_2$ or fused quartz) or another suitable material. The substrate 1412 is opaque to an EUV light, in accordance with some embodiments. The substrate 1412 is made of doped quartz, which is doped with titanium dioxide, in accordance with some embodiments. The substrate 1412 has a thickness T4 ranging from about 3 mm to about 10 mm, in accordance with some embodiments.

The reflective layer 1414 is formed over the substrate 1412, in accordance with some embodiments. The reflective layer 1414 is made of molybdenum (Mo) and silicon, in accordance with some embodiments. The reflective layer 1414 has a multilayer structure, in accordance with some embodiments. The multilayer structure has alternately laminated molybdenum films and silicon films, in accordance with some embodiments.

The reflective layer 1414 has a thickness T5 ranging from about 250 nm to about 350 nm, in accordance with some embodiments. The reflectivity of the reflective layer 1414 ranges from about 60% to about 100%, in accordance with some embodiments. The reflectivity of the reflective layer 1414 ranges from about 65% to about 75%, in accordance with some embodiments.

The adhesive layer 1416 is formed over the reflective layer 1414, in accordance with some embodiments. The adhesive layer 1416 is made of silicon, ruthenium, or another suitable material, in accordance with some embodiments. The adhesive layer 1416 has a thickness T6 ranging from about 1 nm to about 6 nm, in accordance with some embodiments. In some other embodiments, the adhesive layer 1416 is not formed.

As shown in FIG. 14A, a light-absorbing layer 1420 is formed over the adhesive layer 1416, in accordance with some embodiments. The light-absorbing layer 1420 is made of a light-absorbing material, such as tantalum boron nitride (TaBN), tantalum boron oxide (TaBO), tantalum nitride oxide (TaNO), and/or tantalum nitride (TaN), in accordance with some embodiments. The absorbance of the light-absorbing layer 1420 ranges from about 80% to about 100%, in accordance with some embodiments. The absorbance of the light-absorbing layer 1420 ranges from about 90% to about 99%, in accordance with some embodiments.

The absorbance in the application is measured using a light which is suitable to be used in an exposure operation of a photolithography process, in accordance with some embodiments. The light includes an EUV light with a wavelength of about 10 nm to 20 nm, particularly about 13.5 nm±0.3 nm, in accordance with some embodiments.

As shown in FIG. 14A, a mask layer 130 is formed over the light-absorbing layer 1420, in accordance with some embodiments. The mask layer 130 is structurally the same as the mask layer 130 of FIGS. 1A and 1A-1, in accordance with some embodiments. The mask layer 130 has a main portion 132 and assist portions 134 and 136, in accordance with some embodiments. For the sake of simplicity, FIGS.

14A-14E do not show the assist portions 136 of the mask layer 130 of FIG. 1A-1, in accordance with some embodiments.

The main portion 132 covers a portion 1422a of the light-absorbing layer 1420, in accordance with some embodiments. The portion 1422a is over a portion 1410a of the reflective substrate 1410, in accordance with some embodiments. The assist portions 134 cover portions 1424a of the light-absorbing layer 1420, in accordance with some embodiments. The portions 1424a are over portions 1410b of the reflective substrate 1410, in accordance with some embodiments. The portion 1422a is wider than the portion 1424a, in accordance with some embodiments.

The mask layer 130 is made of a material different from that of the light-absorbing layer 1420, in accordance with some embodiments. In some embodiments, the mask layer 130 is made of a photoresist material. The mask layer 130 is formed using processes including photoresist deposition, soft baking, mask aligning, exposing (e.g., patterning), baking, developing the photoresist, hard baking, and/or other processes. In some embodiments, the exposing (e.g., patterning) may include electron-beam writing, ion-beam writing, mask-less lithography, and/or molecular imprint.

In some other embodiments, the mask layer 130 is made of a non-photoresist material. The non-photoresist material includes, for example, a metal material (e.g., Cr). The mask layer 130 is formed using a photolithography process and an etching process, in accordance with some embodiments.

Figure 14B:
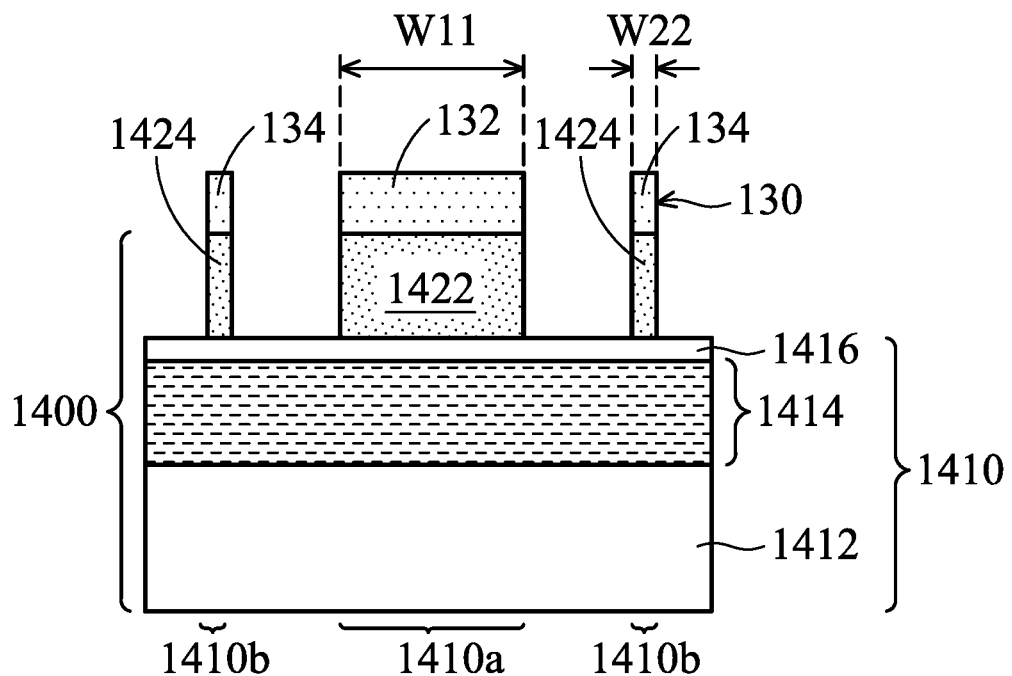

As shown in FIGS. 14A and 14B, the light-absorbing layer 1420, which is not covered by the mask layer 130, is removed, in accordance with some embodiments. The portions 1422a and 1424a remain over the reflective substrate 1410 after the removal process, in accordance with some embodiments. The portion 1422a forms a main light-absorbing structure 1422, in accordance with some embodiments. The portions 1424a respectively form assist light-absorbing structures 1424, in accordance with some embodiments. The main light-absorbing structure 1422, the assist light-absorbing structures 1424, and the reflective substrate 1410 together form a photomask 1400, in accordance with some embodiments.

As shown in FIG. 14B, a width W11 of the main light-absorbing structure 1422 is greater than a width W22 of the assist light-absorbing structure 1424, in accordance with some embodiments. The assist light-absorbing structures 1424 are also referred to as sub-resolution assist features, in accordance with some embodiments.

The assist light-absorbing structures 1424 have small dimensions such that the assist light-absorbing structures 1424 will not image onto a photoresist layer over a semiconductor substrate (e.g., wafer) when the photomask 1400 is irradiated during a subsequent exposure operation of a photolithography process. The removal process includes an etching process, such as a dry etching process (e.g., a plasma etching process), in accordance with some embodiments.

Figure 14C:
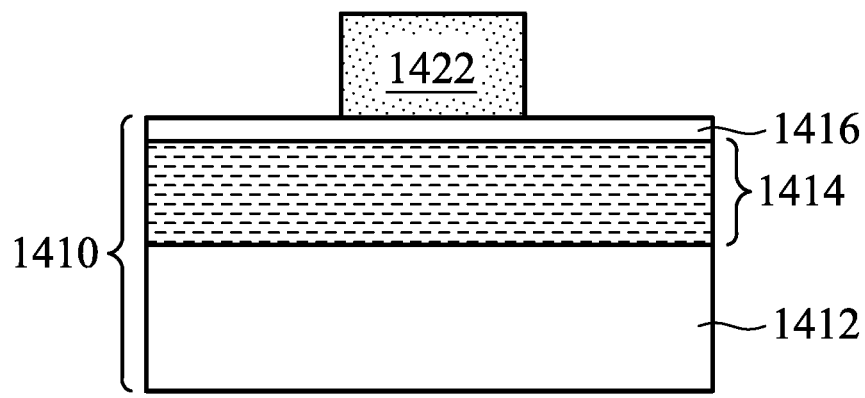

As shown in FIG. 14C, the mask layer 130 is removed, in accordance with some embodiments. The removal process of the mask layer 130 includes an etching process, such as a wet etching process, in accordance with some embodiments. The removal process of the mask layer 130 may also remove the assist light-absorbing structures 1424. The removal of the assist light-absorbing structures 1424 may be undesirable.

Figure 14D:
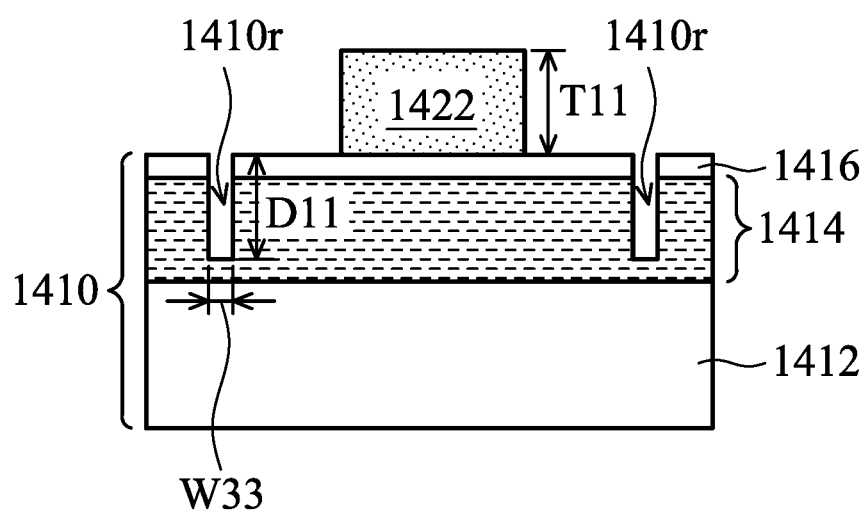

As shown in FIG. 14D, the portions 1410b of the reflective substrate 1410 (as shown in FIG. 14A or 14B) are removed to form recesses 1410r in the reflective substrate 1410, in accordance with some embodiments. As shown in FIG. 14D, a width W33 of the recess 1410r is substantially equal to the width W22 of the assist light-absorbing structure 1424 (as shown in FIG. 14B), in accordance with some embodiments. The term "substantially equal to" means the difference between the widths W22 and W33 is within 20% of the average between the widths W22 and W33, in accordance with some embodiments.

In some embodiments, a depth D11 of the recess 1410r is substantially equal to a thickness T11 of the main light-absorbing structure 1422. The term "substantially equal to" means the difference between the thickness T11 and the depth D11 is within 20% of the average between the thickness T11 and the depth D11, in accordance with some embodiments. The difference may be due to manufacturing processes.

The portions 1410b of the reflective substrate 1410 (as shown in FIG. 1A or 1B) are removed using an etching process, a scratch process, or another suitable process. The etching process includes an electron beam-induced etching process, an ion beam-induced etching process, or another suitable process.

Figure 14E:
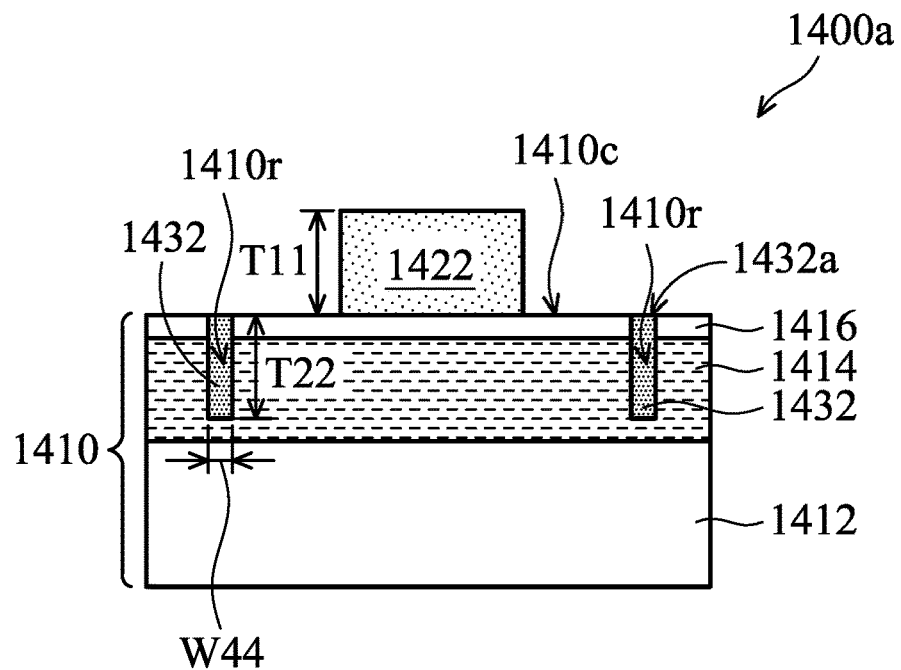

As shown in FIG. 14E, assist light-absorbing structures 1432 are respectively formed in the recesses 1410r, in accordance with some embodiments. In this step, a (repaired) photomask 1400a is formed, in accordance with some embodiments. The photomask 1400a includes the reflective substrate 1410, the main light-absorbing structure 1422, and the assist light-absorbing structures 1432, in accordance with some embodiments.

In some embodiments, the recesses 1410r are completely filled with the assist light-absorbing structures 1432. The recesses 1410r and the assist light-absorbing structures 1432 pass through the adhesive layer 1416 and extend into the reflective layer 1414, in accordance with some embodiments. In some embodiments, a top surface 1432a of the assist light-absorbing structure 1432 is substantially aligned with (or substantially coplanar with) a top surface 1410c of the reflective substrate 1410.

In some embodiments, a thickness T22 of the assist light-absorbing structure 1432 is substantially equal to the thickness T11 of the main light-absorbing structure 1422. The term "substantially equal to" means the difference between the thicknesses T11 and T22 is within 20% of the average thickness between the assist light-absorbing structure 1432 and the main light-absorbing structure 1422, in accordance with some embodiments. The difference may be due to manufacturing processes.

The width W44 of the assist light-absorbing structure 1432 is substantially equal to the width W22 of the assist light-absorbing structure 1424 (as shown in FIG. 14B), in accordance with some embodiments. The light-absorbing layer 1420 (as shown in FIG. 14A) and the assist light-absorbing structures 1432 are made of different materials, in accordance with some embodiments. In some other embodiments, the light-absorbing layer 1420 (as shown in FIG. 14A) and the assist light-absorbing structures 1432 are made of the same material.

The assist light-absorbing structures 1432 are made of a light-absorbing material, such as $Cr_2O_3$, tantalum boron nitride (TaBN), tantalum boron oxide (TaBO), tantalum nitride oxide (TaNO), and/or tantalum nitride (TaN), in accordance with some embodiments. The assist light-absorbing structures 1432 and the reflective substrate 1410 are made of different materials, in accordance with some embodiments.

The assist light-absorbing structures 1432 are formed using an electron beam-induced deposition process, an ion beam-induced deposition process, or another suitable process. In some embodiments, the recesses 1410r and the assist light-absorbing structures 1432 are formed in the same chamber, such as an electron beam chamber or an ion beam chamber.

Since the assist light-absorbing structures 1432 are formed in the recesses 1410r, the assist light-absorbing structures 1432 are fixed to the reflective substrate 1410 by the recesses 1410r, in accordance with some embodiments. Therefore, the assist light-absorbing structures 1432 are prevented from peeling from the reflective substrate 1410, in accordance with some embodiments. As a result, the formation of the recesses 1410r improves the yield of the process for forming the assist light-absorbing structures 1432, in accordance with some embodiments.

Figure 15:
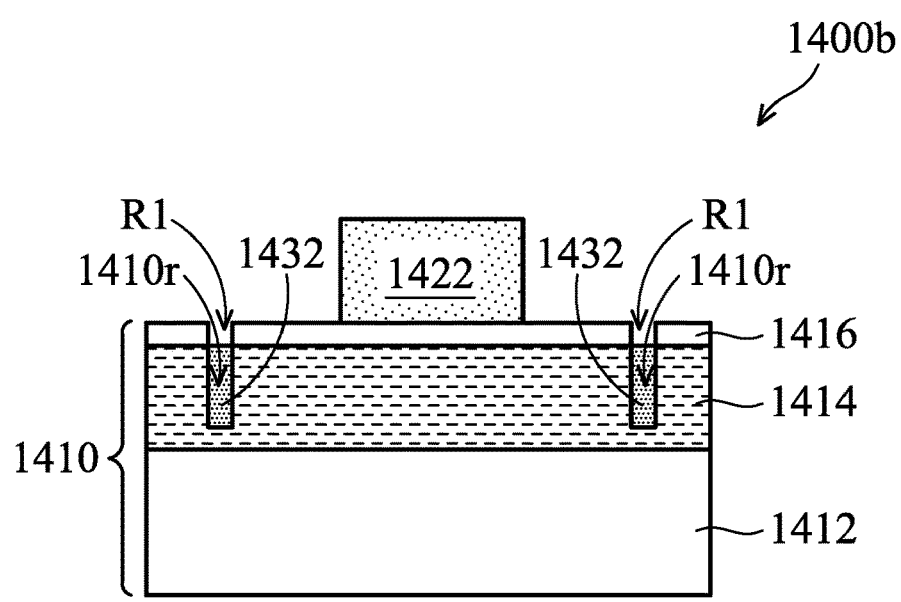
FIG. 15 is a cross-sectional view of a photomask, in accordance with some embodiments.

FIG. 15 is a cross-sectional view of a photomask 1400b, in accordance with some embodiments. As shown in FIG. 15, the photomask 1400b is similar to the photomask 1400a of FIG. 14E, except that the recesses 1410r of the reflective substrate 1410 of the photomask 1400b are partially filled with the assist light-absorbing structures 1432, in accordance with some embodiments. In some embodiments, a recess R1 is surrounded by the assist light-absorbing structures 1432 and the reflective substrate 1410.

Figure 16:
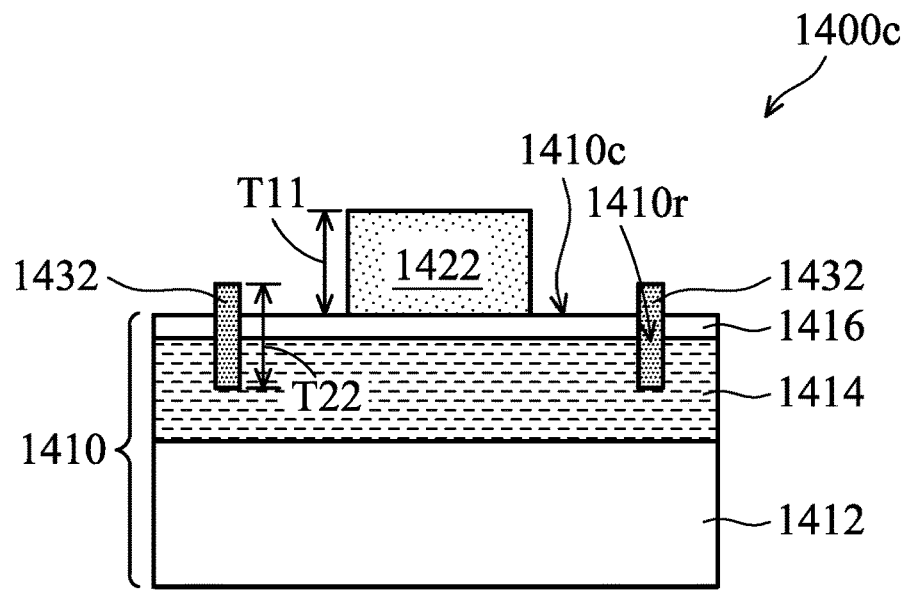
FIG. 16 is a cross-sectional view of a photomask, in accordance with some embodiments.

FIG. 16 is a cross-sectional view of a photomask 1400c, in accordance with some embodiments. As shown in FIG. 16, the photomask 1400c is similar to the photomask 1400a of FIG. 14E, except that the assist light-absorbing structures 1432 of the photomask 1400c extend out of the recesses 1410r, in accordance with some embodiments.

That is, the assist light-absorbing structures 1432 protrude from the top surface 1410c of the reflective substrate 1410, in accordance with some embodiments. In some embodiments, the thickness T22 of the assist light-absorbing structure 1432 is substantially equal to the thickness T11 of the main light-absorbing structure 1422.

Figure 17:
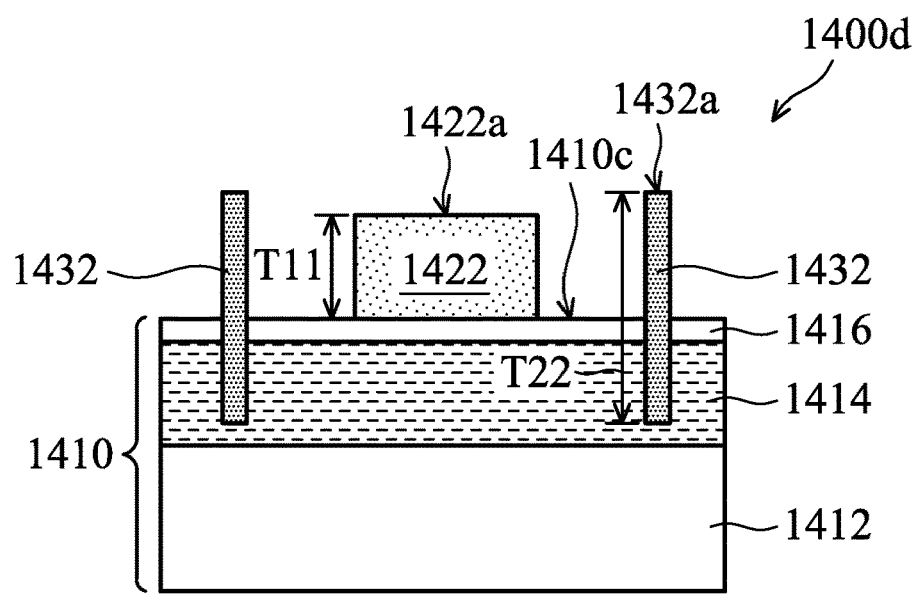
FIG. 17 is a cross-sectional view of a photomask, in accordance with some embodiments.

FIG. 17 is a cross-sectional view of a photomask 1400d, in accordance with some embodiments. As shown in FIG. 17, the photomask 1400d is similar to the photomask 1400c of FIG. 16, except that the top surface 1432a of the assist light-absorbing structure 1432 is positioned higher than the top surface 1422a of the main light-absorbing structure 1422 relative to the top surface 1410c of the reflective substrate 1410, in accordance with some embodiments. In some embodiments, the thickness T22 of the assist light-absorbing structure 1432 is greater than the thickness T11 of the main light-absorbing structure 1422.

Figure 18:
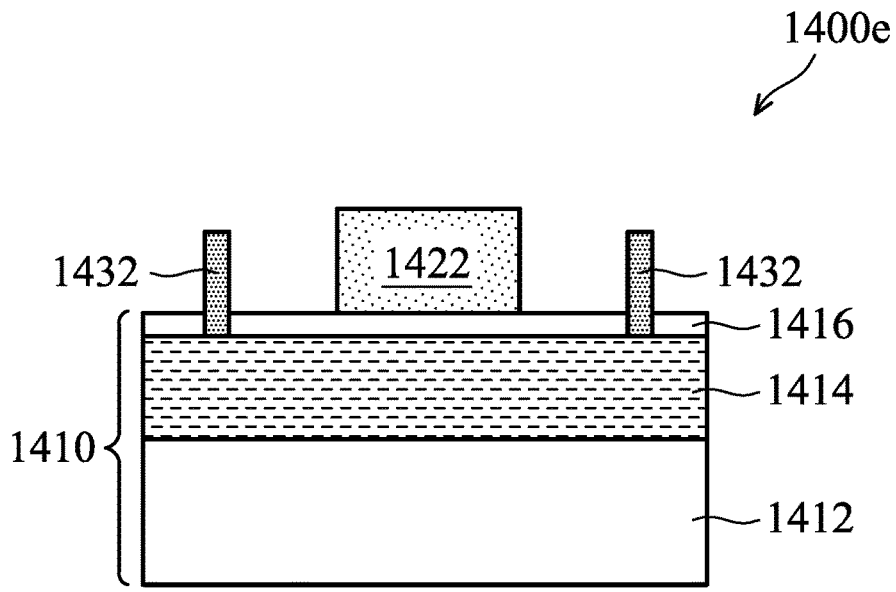
FIG. 18 is a cross-sectional view of a photomask, in accordance with some embodiments.

FIG. 18 is a cross-sectional view of a photomask 1400e, in accordance with some embodiments. As shown in FIG. 18, the photomask 1400e is similar to the photomask 1400c of FIG. 16, except that the assist light-absorbing structures 1432 does not extend into the reflective layer 1414, in accordance with some embodiments. The assist light-absorbing structures 1432 pass through the adhesive layer 1416, in accordance with some embodiments. In some other embodiments (not shown), the assist light-absorbing structures 1432 do not pass through the adhesive layer 1416.

Figure 19:
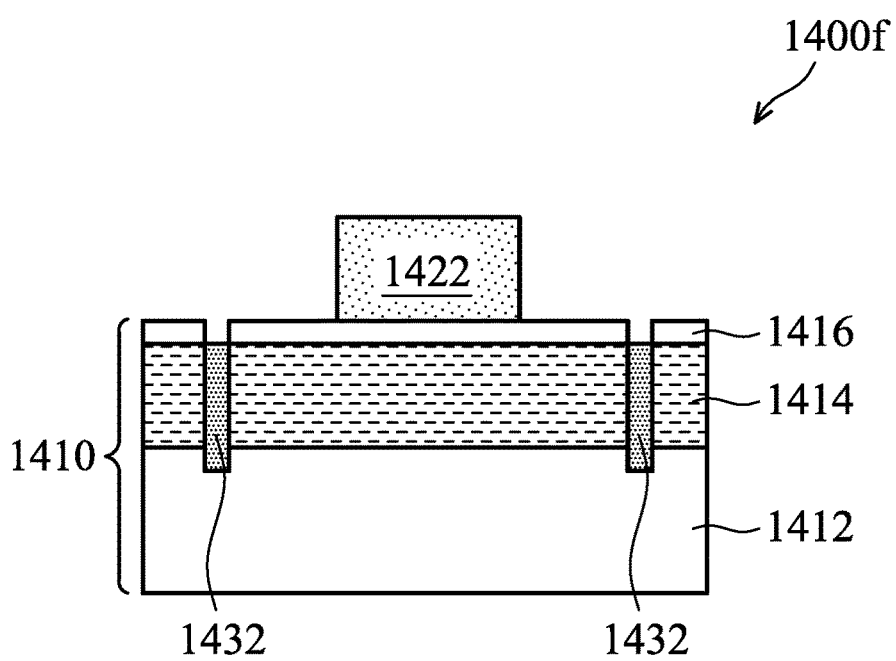
FIG. 19 is a cross-sectional view of a photomask, in accordance with some embodiments.

FIG. 19 is a cross-sectional view of a photomask 1400f, in accordance with some embodiments. As shown in FIG. 19, the photomask 1400f is similar to the photomask 1400b of FIG. 15, except that the assist light-absorbing structures 1432 of the photomask 1400f further extend into the substrate 1412, in accordance with some embodiments. The assist light-absorbing structures 1432 pass through the reflective layer 1414, in accordance with some embodiments.

Figure 20A:
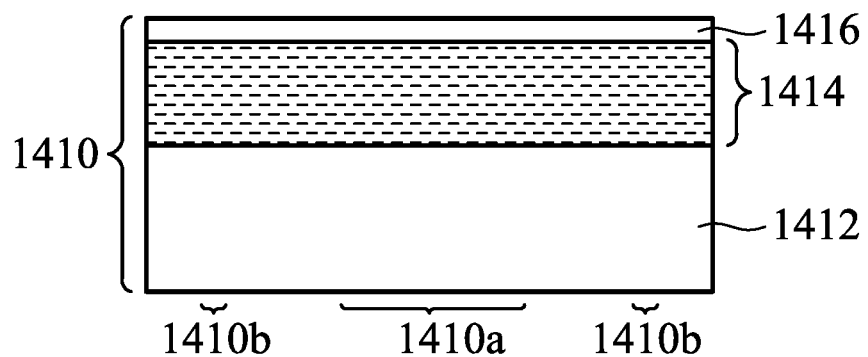
FIGS. 20A-20C are cross-sectional views of various stages of a process for forming a photomask, in accordance with some embodiments.
Figure 20B:
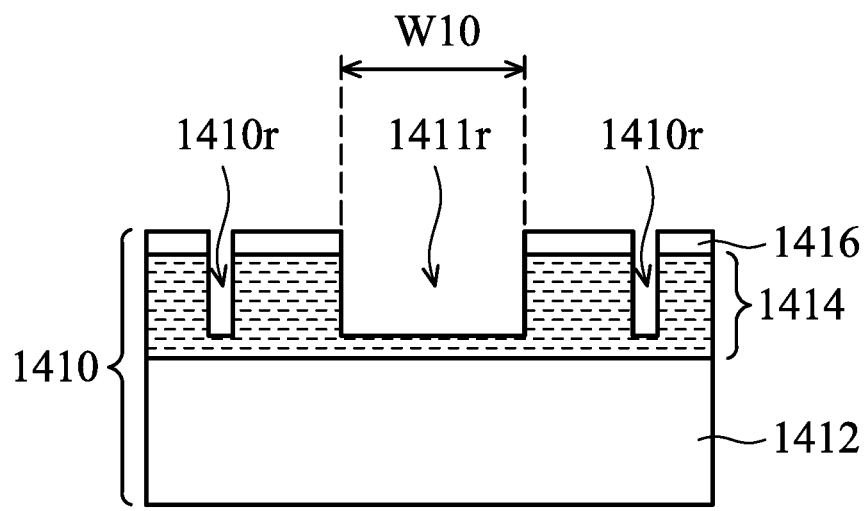
Figure 20C:
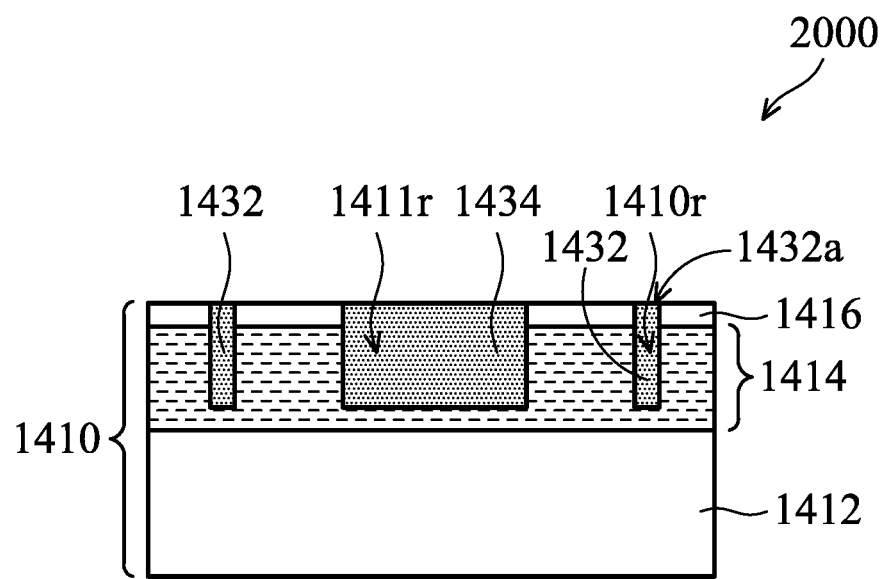

FIGS. 20A-20C are cross-sectional views of various stages of a process for forming a photomask, in accordance with some embodiments. As shown in FIG. 20A, after the step of FIG. 14B, the mask layer 130 is removed, in accordance with some embodiments.

The removal process of the mask layer 130 may also remove the assist light-absorbing structures 1424 and the main light-absorbing structure 1422. The removal process of the mask layer 130 includes an etching process, such as a wet etching process, in accordance with some embodiments.

As shown in FIG. 20B, the portions 1410a and 1410b of the reflective substrate 1410 (as shown in FIG. 14A) are removed to form recesses 1411r and 1410r in the reflective substrate 1410, in accordance with some embodiments. In some embodiments, a width W10 of the recess 1411r is substantially equal to the width W11 of the main light-absorbing structure 1422 (as shown in FIG. 14B).

The portions 1410a and 1410b of the reflective substrate 1410 (as shown in FIG. 14A) are removed using an etching process, a scratch process, or another suitable process. The etching process includes an electron beam-induced etching process, an ion beam-induced etching process, or another suitable process.

As shown in FIG. 20C, a main light-absorbing structure 1434 and assist light-absorbing structures 1432 are respectively formed in the recesses 1411r and 1410r, in accordance with some embodiments. The main light-absorbing structure 1434 and the assist light-absorbing structures 1432 pass through the adhesive layer 1416 and extend into the reflective layer 1414, in accordance with some embodiments.

The main light-absorbing structure 1434 and the assist light-absorbing structure 1432 are made of the same material, in accordance with some embodiments. The main light-absorbing structure 1434 and the assist light-absorbing structure 1432 are made of a light-absorbing material, such as $Cr_2O_3$, tantalum boron nitride (TaBN), tantalum boron oxide (TaBO), tantalum nitride oxide (TaNO), and/or tantalum nitride (TaN), in accordance with some embodiments.

The main light-absorbing structure 1434 and the assist light-absorbing structures 1432 are formed using an electron beam-induced deposition process, an ion beam-induced deposition process, or another suitable process. In some embodiments, the recesses 1411r and 1410r, the main light-absorbing structure 1434, and the assist light-absorbing structures 1432 are formed in the same chamber, such as an electron beam chamber or an ion beam chamber. In this step, a (repaired) photomask 2000 is formed, in accordance with some embodiments.

Figure 21:
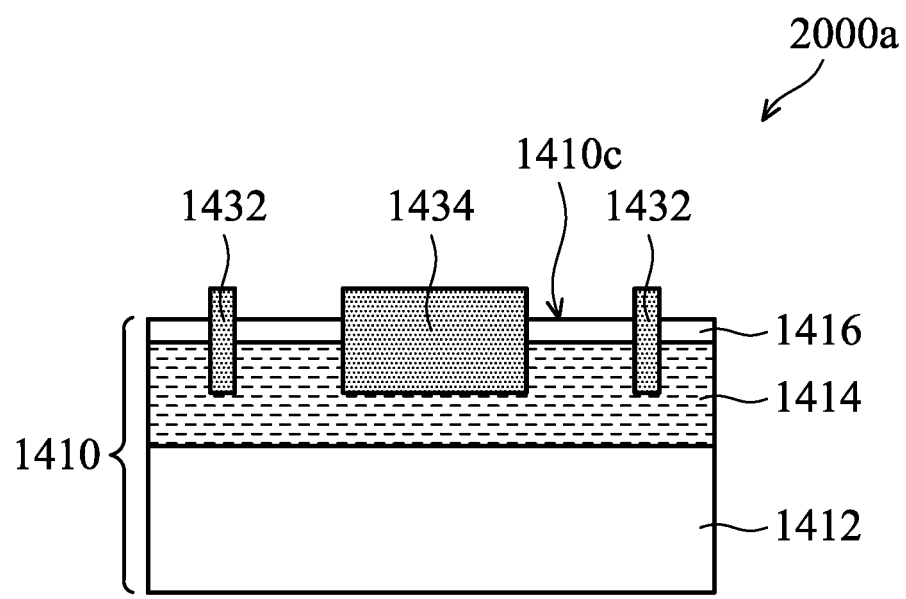
FIG. 21 is a cross-sectional view of a photomask, in accordance with some embodiments.

FIG. 21 is a cross-sectional view of a photomask 2000a, in accordance with some embodiments. As shown in FIG. 21, the photomask 2000a is similar to the photomask 2000 of FIG. 20C, except that the assist light-absorbing structures 1432 and the main light-absorbing structure 1434 protrude from the top surface 1410c of the reflective substrate 1410, in accordance with some embodiments.

Figure 22:
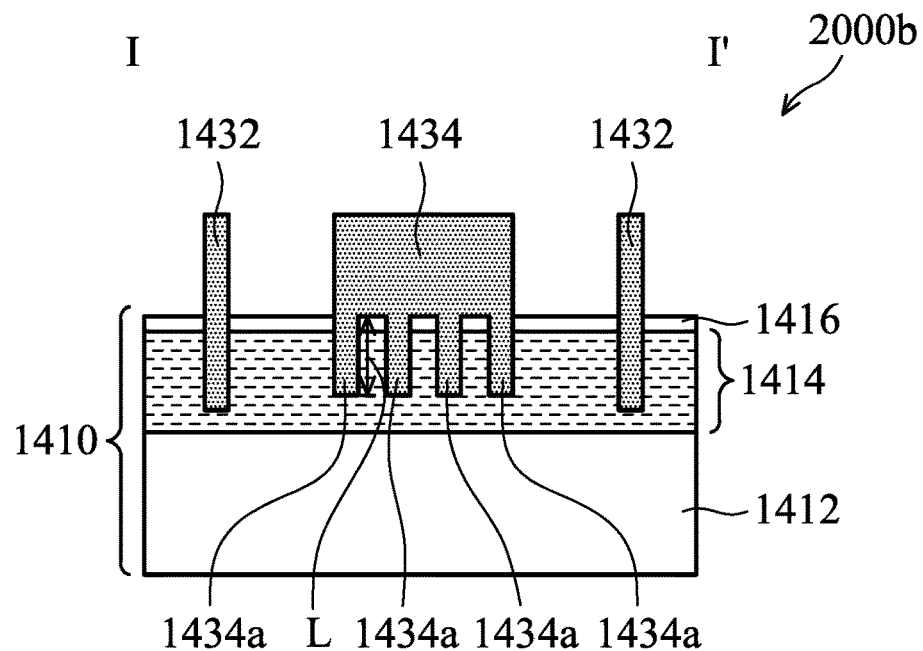
FIG. 22 is a cross-sectional view of a photomask, in accordance with some embodiments.

FIG. 22 is a cross-sectional view of a photomask 2000b, in accordance with some embodiments. As shown in FIG. 22, the photomask 2000b is similar to the photomask 2000a of FIG. 21, except that main light-absorbing structure 1434 has extending portions 1434a extending into the reflective substrate 1410, in accordance with some embodiments.

The extending portions 1434a are spaced apart from each other, in accordance with some embodiments. The extending portions 1434a are spaced apart from each other by the same distance, in accordance with some embodiments. In some other embodiments, the extending portions 1434a are spaced apart from each other by different distances.

In some embodiments, the extending portions 1434a are substantially parallel to each other. In some embodiments, the extending portions 1434a have the same extending length L. In some embodiments (not shown), the extending portions 1434a have different extending lengths.

Figure 22A:
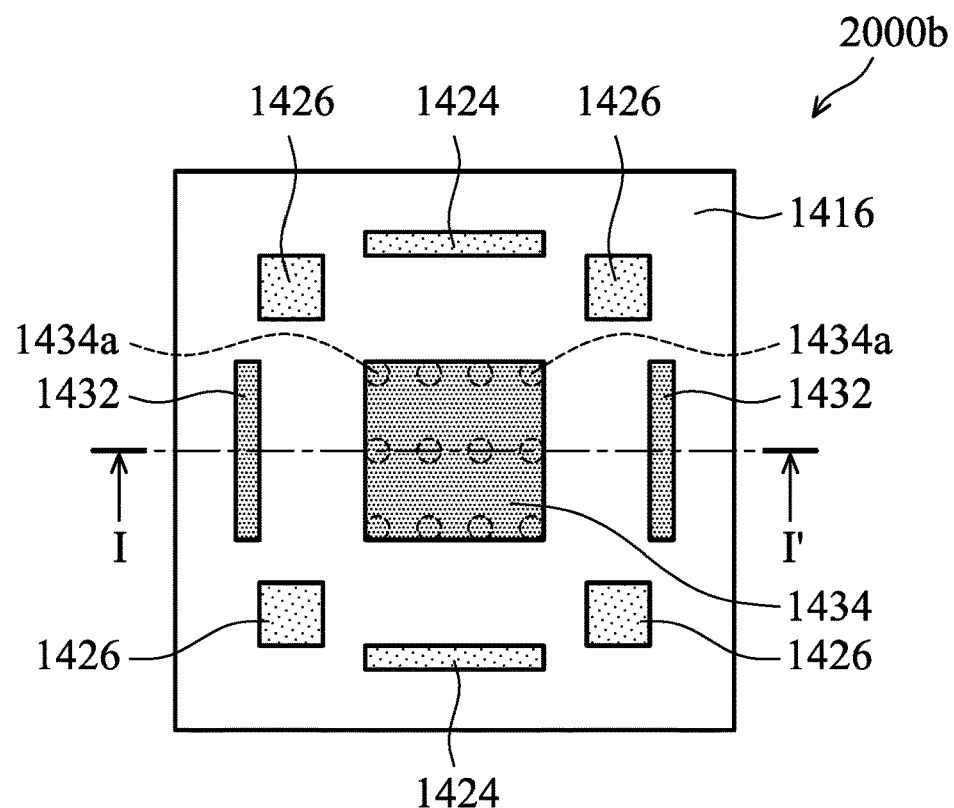
FIG. 22A is a top view of the photomask of FIG. 22, in accordance with some embodiments.

FIG. 22A is a top view of the photomask 2000b of FIG. 22, in accordance with some embodiments. FIG. 22 is a cross-sectional views illustrating the photomask 2000b along a sectional line I-I' in FIG. 22A, in accordance with some embodiments. As shown in FIGS. 22 and 22A, the extending portions 1434a have a pillar shape, in accordance with some embodiments. The extending portions 1434a are cylindrical pillars, in accordance with some embodiments.

FIG. 22A shows the remaining assist light-absorbing structures 1424 and 1426, in accordance with some embodiments. The remaining assist light-absorbing structures 1426 are originally covered by the assist portions 136 of the mask layer 130 of FIGS. 14A and 1A-1, in accordance with some embodiments.

Figure 22B:
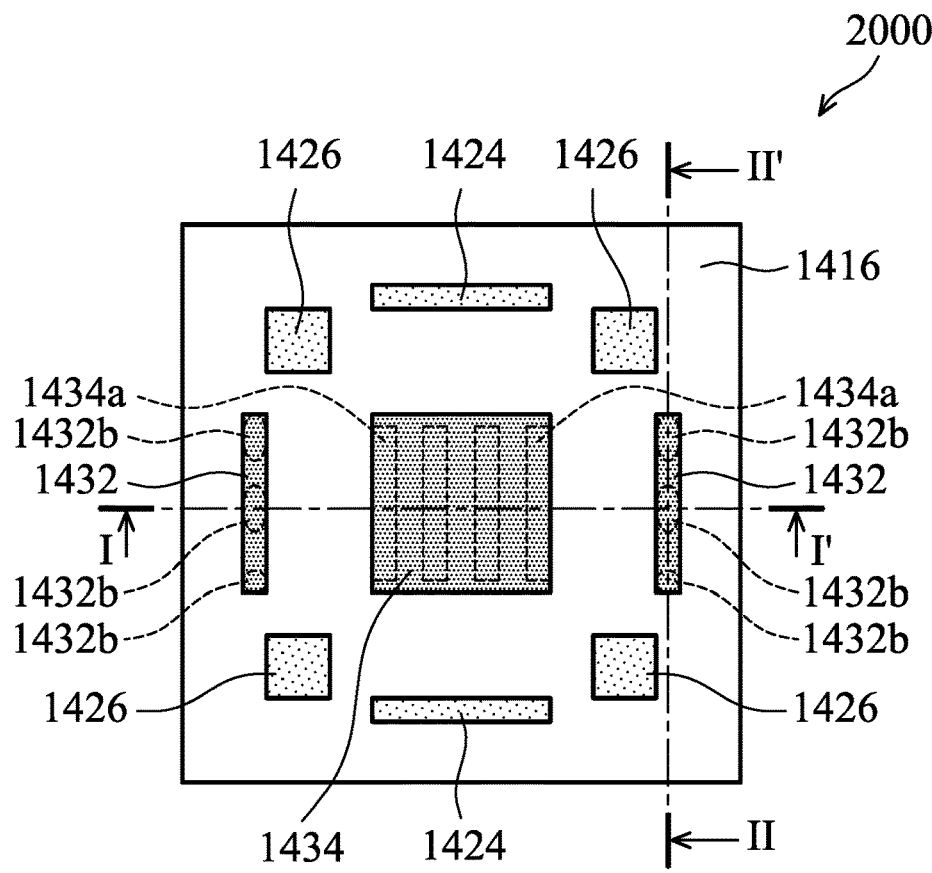
FIG. 22B is a top view of the photomask of FIG. 22, in accordance with some embodiments.

FIG. 22B is a top view of the photomask 2000b of FIG. 22, in accordance with some embodiments. FIG. 22 is a cross-sectional views illustrating the photomask 2000b along a sectional line I-I' in FIG. 22B, in accordance with some embodiments. As shown in FIGS. 22 and 22B, the extending portions 1434a have a rectangular shape, in accordance with some embodiments. The extending portions 1434a have a sheet shape, in accordance with some embodiments.

Figure 22C:
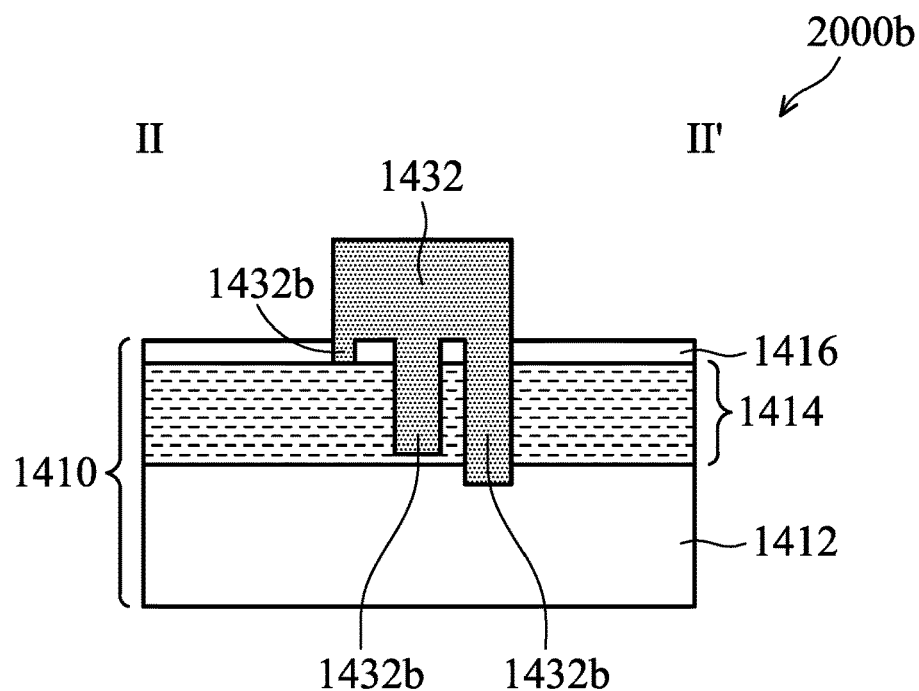
FIG. 22C is a cross-sectional views illustrating the photomask along a sectional line II-II' in FIG. 22B, in accordance with some embodiments.

FIG. 22C is a cross-sectional views illustrating the photomask 2000b along a sectional line II-II' in FIG. 22B, in accordance with some embodiments. As shown in FIGS. 22B and 22C, the assist light-absorbing structure 1432 has extending portions 1432b, in accordance with some embodiments. The extending portions 1432b have different widths or the same width. The extending portions 1432b have different extending lengths or the same extending length. The extending portions 1432b are spaced apart by different distances or the same distance.

Figure 23:
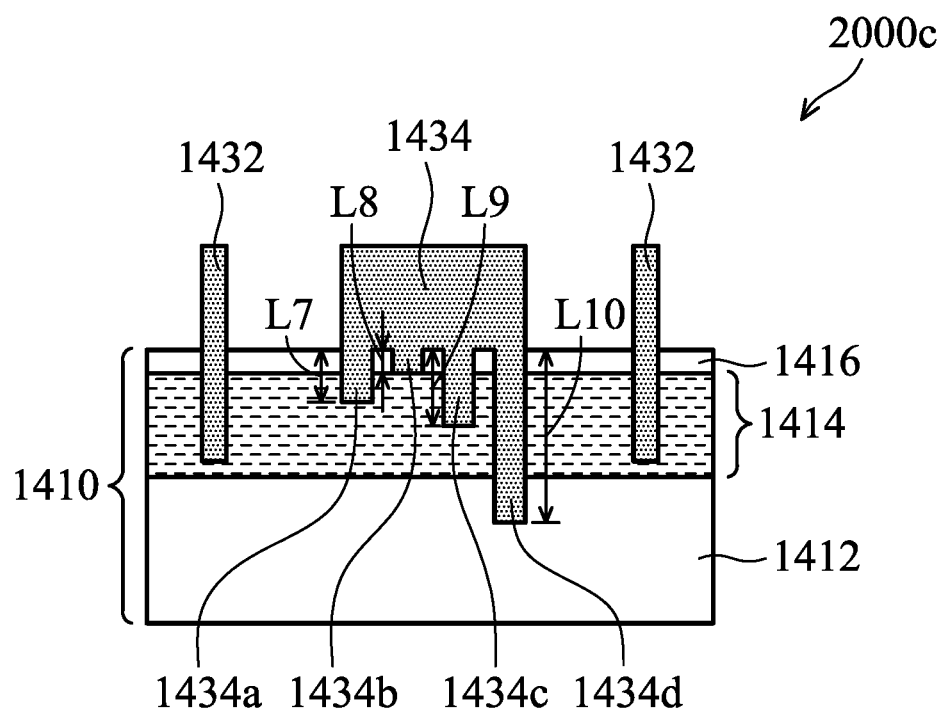
FIG. 23 is a cross-sectional view of a photomask, in accordance with some embodiments.

FIG. 23 is a cross-sectional view of a photomask 2000c, in accordance with some embodiments. As shown in FIG. 23, the photomask 2000c is similar to the photomask 2000b of FIG. 22, except that main light-absorbing structure 1434 has extending portions 1434a, 1434b, 1434c and 1434d extending into the reflective substrate 1410, in accordance with some embodiments.

The extending portions 1434a, 1434b, 1434c and 1434d have different widths, in accordance with some embodiments. The extending portions 1434a, 1434b, 1434c and 1434d are spaced apart from each other by different distances, in accordance with some embodiments. The extending portion 1434b extends into the adhesive layer 1416 and does not extend into the reflective layer 1414, in accordance with some embodiments.

The extending portion 1434d passes through the adhesive layer 1416 and the reflective layer 1414 and extends into the substrate 1412, in accordance with some embodiments. The extending portions 1434a, 1434b, 1434c and 1434d have different extending lengths L7, L8, L9, and L10, in accordance with some embodiments.

Figure 24:
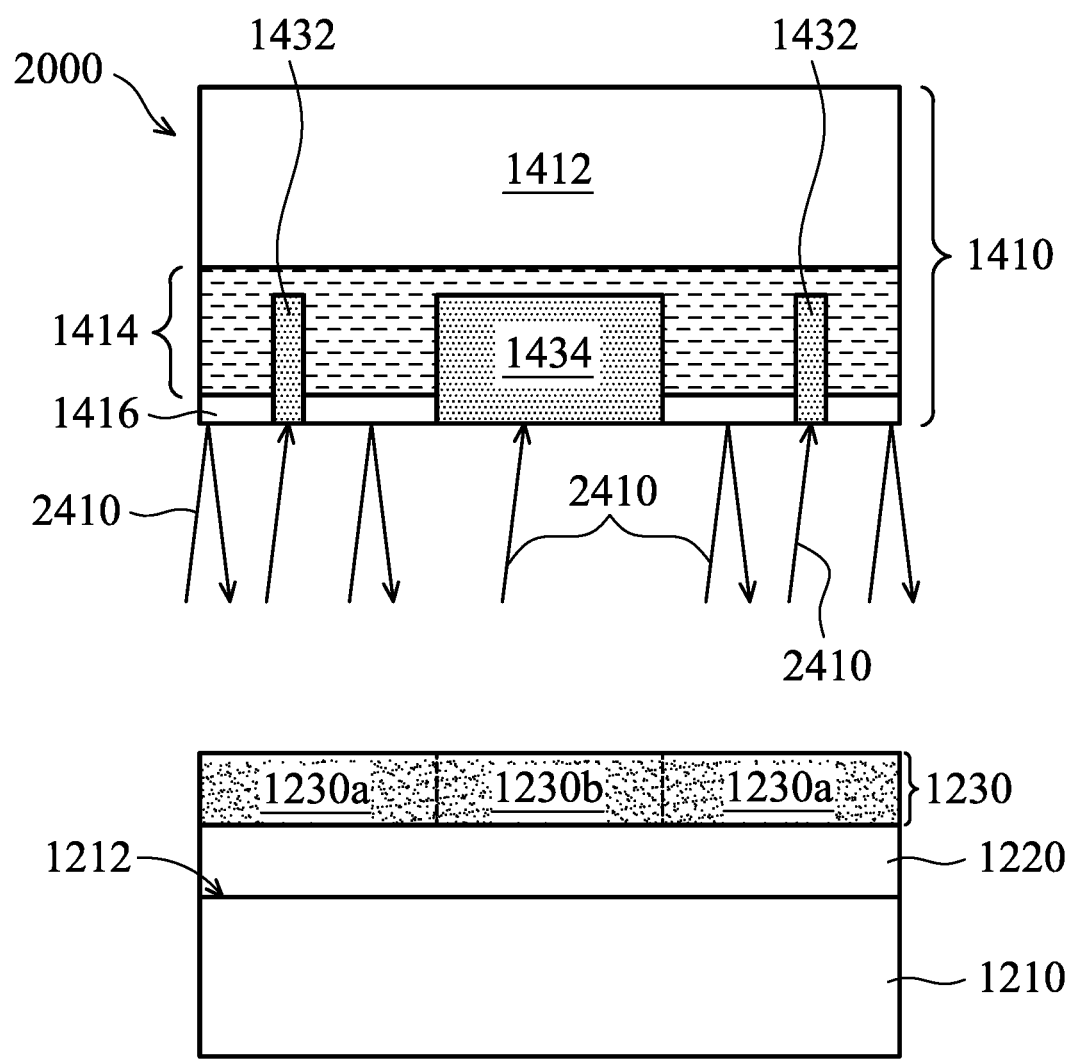
FIG. 24 is a cross-sectional view of a process for forming a semiconductor device structure, in accordance with some embodiments.

FIG. 24 is a cross-sectional view of a process for forming a semiconductor device structure, in accordance with some embodiments. As shown in FIG. 24, the substrate 1210, the layer 1220, and the photoresist layer 1230 of FIG. 12A are provided, in accordance with some embodiments.

As shown in FIG. 24, a photoresist layer 1230 is formed over the layer 1220, in accordance with some embodiments. As shown in FIG. 24, the photomask 2000 of FIG. 20C is positioned over the photoresist layer 1230, in accordance with some embodiments. The photomask 2000 may be replaced with the photomask 1400a, 1400b, 1400c, 1400d, 1400e, 1400f, 2000a, 2000b, or 2000c of FIG. 14E, 15-19, or 21-23.

As shown in FIG. 24, an exposure process is performed, in accordance with some embodiments. During the exposure process, the photomask 2000 is irradiated by a light 2410, in accordance with some embodiments. A portion of the light 2410 is reflected by the reflective substrate 1410 and irradiates a portion 1230a of the photoresist layer 1230, in accordance with some embodiments.

A portion of the light 2410 is absorbed by the assist light-absorbing structures 1432 and the main light-absorbing structure 1434, and therefore a portion 1230b of the photoresist layer 1230 is not irradiated by the light 2410, in accordance with some embodiments. Thereafter, the steps of FIGS. 12B-12D or the steps of FIGS. 13A-13C are performed, in accordance with some embodiments.

The photomasks 100a-100g, 800, and 800a-800c of FIGS. 1E, 2-7B, 8C, and 9-11 are transmissive photomasks, in accordance with some embodiments. The photomasks 1400a-1400f, 2000, 2000a-2000c of FIGS. 14E, 15-19, 20C, and 21-23 are reflective photomasks, in accordance with some embodiments.

The structures of the assist light-absorbing structures 1432 of the photomasks 1400a-1400f, 2000, 2000a-2000c of FIGS. 14E, 15-19, 20C, and 21-23 are similar to or the same as the structures of the assist light blocking structures 142 of the photomasks 100a-100g, 800, and 800a-800c of FIGS. 1E, 2-7B, 8C, and 9-11, in accordance with some embodiments. The structures of the main light-absorbing structures 1434 of FIGS. 20C and 21-23 are similar to or the same as the structures of the main light blocking structures 144 of FIGS. 8C and 9-11, in accordance with some embodiments.

In accordance with some embodiments, photomasks and methods for forming the same are provided. The methods (for forming the photomask) sequentially form a light blocking layer and a mask layer over a transparent substrate, and remove the light blocking layer, which is not covered by the mask layer. Thereafter, the methods remove the mask layer. A portion of the light blocking layer originally covered by the mask layer is removed during removing the mask layer. The methods form a light blocking structure in the transparent substrate originally under the portion of the light blocking layer. The formation of the light blocking structure may repair the damage to the light blocking layer caused by the removal of the mask layer. Furthermore, since the light blocking structure is formed in the transparent substrate, the light blocking structure is prevented from peeling from the transparent substrate. The methods are able to repair transmissive photomasks. The methods are also able to repair reflective photomasks.

In accordance with some embodiments, a method for forming a photomask is provided. The method includes forming a light blocking layer over a transparent substrate. The method includes forming a mask layer over the light blocking layer. The mask layer covers a first portion of the light blocking layer, and the first portion is over a second portion of the transparent substrate. The method includes removing the light blocking layer, which is not covered by the mask layer. The method includes removing the mask layer. The first portion of the light blocking layer is removed during removing the mask layer. The method includes removing the second portion of the transparent substrate to form a first recess in the transparent substrate. The method includes forming a first light blocking structure in the first recess.

In accordance with some embodiments, a method for forming a photomask is provided. The method includes forming a light-absorbing layer over a reflective substrate. The method includes forming a mask layer over the light-absorbing layer. The mask layer covers a first portion of the light-absorbing layer, and the first portion is over a second portion of the reflective substrate. The method includes removing the light-absorbing layer, which is not covered by the mask layer. The method includes removing the mask layer. The first portion of the light-absorbing layer is removed during removing the mask layer. The method includes removing the second portion of the reflective substrate to form a recess in the reflective substrate. The method includes forming a light-absorbing structure in the recess.

In accordance with some embodiments, a method for forming a photomask is provided. The method includes providing a photomask over a photoresist layer. The photomask includes a transparent substrate having a surface; a first light blocking structure over the surface; and a second light blocking structure in the transparent substrate. The method includes irradiating the photomask by a light. The light passes through the transparent substrate and irradiates a first portion of the photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photomask, comprising:
   forming a light blocking layer over a transparent substrate;
   forming a mask layer over the light blocking layer, wherein the mask layer covers the light blocking layer in a main portion over a first portion of the transparent substrate and an assist portion over a second portion of the transparent substrate;
   removing the light blocking layer, which is not covered by the mask layer;
   removing the mask layer, wherein the assist portion of the light blocking layer is removed during removing the mask layer, while the main portion remains;
   after removing the mask layer and the assist portion, removing the second portion of the transparent substrate to form a first recess in the transparent substrate; and
   forming a first light blocking structure in the first recess.

2. The method for forming the photomask as claimed in claim 1, wherein a first length of the first recess is substantially equal to a second length of the mask layer.

3. The method for forming the photomask as claimed in claim 1, wherein a first length of the first recess is less than a second length of the mask layer.

4. The method for forming the photomask as claimed in claim 3, wherein the removing of the second portion of the transparent substrate further forms a second recess in the transparent substrate, the second recess is spaced apart from the first recess, and the first light blocking structure is further formed in the second recess and formed over the transparent substrate between the first recess and the second recess.

5. The method for forming the photomask as claimed in claim 1, wherein the mask layer further covers a third portion of the light blocking layer, the third portion is wider than the first portion, the third portion is over a fourth portion of the transparent substrate, the third portion is removed during removing the mask layer,
   the removing of the second portion of the transparent substrate further comprises removing the fourth portion to form a second recess in the transparent substrate, and the forming of the first light blocking structure in the first recess further comprises forming a second light blocking structure in the second recess.

6. The method for forming the photomask as claimed in claim 1, wherein the mask layer further covers a third portion of the light blocking layer, the third portion is wider than the first portion, and the third portion is remained after removing the mask layer.

7. The method for forming the photomask as claimed in claim 1, wherein the forming of the first recess in the transparent substrate comprises performing an electron beam-induced etching process or an ion beam-induced etching process, and the forming of the first light blocking structure comprises performing an electron beam-induced deposition process or an ion beam-induced deposition process.

8. The method for forming the photomask as claimed in claim 7, wherein the forming of the first recess and the forming of the first light blocking structure are performed in a same chamber.

9. The method for forming the photomask as claimed in claim 1, wherein the light blocking layer and the first light blocking structure are made of a same material.

10. A method for forming a photomask, comprising:
    forming a light-absorbing layer over a reflective substrate;
    forming a mask layer over the light-absorbing layer, wherein the mask layer directly covers the light-absorbing layer in a main portion over a first portion of the reflective substrate and an assist portion over a second portion of the reflective substrate;
    removing the light-absorbing layer, which is not covered by the mask layer;
    removing the mask layer, wherein the assist portion of the light-absorbing layer, which is directly covered by the mask layer, is removed during removing the mask layer, while the main portion remains;
    removing the second portion of the reflective substrate to form a recess in the reflective substrate; and
    forming a light-absorbing structure in the recess.

11. The method for forming the photomask as claimed in claim 10, wherein a first width of the light-absorbing structure is substantially equal to a second width of the first portion of the light-absorbing layer.

12. The method for forming the photomask as claimed in claim 10, wherein the reflective substrate comprises a substrate and a reflective layer, the reflective layer is formed over the substrate, and the recess is formed in the reflective layer.

13. The method for forming the photomask as claimed in claim 12, wherein the reflective substrate further comprises an adhesive layer over the reflective layer, and the recess passes through the adhesive layer.

14. The method for forming the photomask as claimed in claim 13, wherein the recess passes through the reflective layer and extends into the substrate.

15. The method for forming the photomask as claimed in claim 10, wherein a portion of the light-absorbing structure is outside of the recess.

16. A photolithography method, comprising:
providing a photomask over a photoresist layer, wherein the photomask comprises:
    a transparent substrate having a surface;
    a main portion comprising a first light blocking structure over the surface; and
    an assist portion comprising a second light blocking structure in the transparent substrate, wherein the second light blocking structure has a first portion, a second portion, and a third portion, the first portion extends into the transparent substrate to a first depth, the second portion extends into the transparent substrate to a second depth, the first depth is different from the second depth, the first portion and the second portion are separated from each other by a fourth portion of the transparent substrate, and the third portion is over the surface of the transparent substrate and is connected to the first portion and the second portion; and
irradiating the photomask by a light, wherein the light passes through the transparent substrate and irradiates a first portion of the photoresist layer.

17. The photolithography method as claimed in claim 16, further comprising:
removing the first portion of the photoresist layer after irradiating the photomask.

18. The photolithography method as claimed in claim 16, further comprising:
removing a second portion of the photoresist layer after irradiating the photomask, wherein the second portion of the photoresist layer is not irradiated by the light.

19. The photolithography method as claimed in claim 16, wherein a top surface of the second light blocking structure is aligned with the surface.

20. The photolithography method as claimed in claim 16, wherein the first portion is wider than the second portion.

* * * * *